United States Patent [19]

Sachs et al.

[11] Patent Number: 5,512,162
[45] Date of Patent: Apr. 30, 1996

[54] METHOD FOR PHOTO-FORMING SMALL SHAPED METAL CONTAINING ARTICLES FROM POROUS PRECURSORS

[75] Inventors: Emanuel Sachs, Somerville; Che-Chih Tsao, Cambridge, both of Mass.

[73] Assignee: Massachusetts Institute of Technology, Cambridge, Mass.

[21] Appl. No.: 929,604

[22] Filed: Aug. 13, 1992

[51] Int. Cl.$^6$ .............................. C23C 28/00; B05D 3/06
[52] U.S. Cl. ..................... 205/91; 156/272.8; 156/273.3; 205/114; 205/123; 205/136; 205/150; 205/161; 205/170; 205/184; 427/214; 427/217; 427/222; 427/304; 427/305; 427/306; 427/404; 427/581; 430/325; 430/394
[58] Field of Search .............................. 205/91, 114, 183, 205/184, 187, 144, 150, 161, 170, 918, 123, 136; 427/212, 222, 214, 215, 216, 217, 243, 581, 595, 596, 597, 404, 304–306; 430/322, 325, 394, 396; 156/272.2, 272.8, 273.3, 273.9, 275.1; 118/620

[56] References Cited

U.S. PATENT DOCUMENTS

| | | | |
|---|---|---|---|
| 4,239,789 | 12/1980 | Blum et al. | 427/555 |
| 4,802,951 | 2/1989 | Clark et al. | 156/630 |
| 5,071,337 | 12/1991 | Heller et al. | 425/174.4 |
| 5,128,235 | 7/1992 | Vasilliou et al. | 430/322 |
| 5,133,987 | 7/1992 | Spence et al. | 427/581 |
| 5,151,153 | 9/1992 | Bol | 216/2 |
| 5,182,170 | 1/1993 | Marcus et al. | 428/551 |
| 5,190,637 | 3/1993 | Guckel | 205/118 |

OTHER PUBLICATIONS

Young, Wayne, "Multilayer Ceramic Technology" from Electronic Ceramics, properties, devices and applications; ed. Levinsen, L, Marcel Dekker, Inc., New York, N.Y. (1988).

Pearlstein, F., "Electroless Plating," *Modern Electroplating*, John Wiley & Sons, New York pp. 710–747 (1974).

F. L. Siegrist, "Have You Considered Electroforming?" Metal Progress, Oct. 1964, pp. 219–230.

F. L. Siegrist, "Electroforming with Nickel: A Versatile Production Technique," Metal Progress, Nov. 1964, pp. 121–130.

H. Reiche, W. W. Dunn, and A. J. Bard, "Heterogeneous Photocatalytic and Photosynthetic Deposition of Copper on $TiO_2$ and $WO_3$ Powders," Journal of Physical Chemistry, vol. 83, No. 17, 1979, p. 2248.

Y. C. Kiang, J. R. Moulic, and J. Zahavi, "Metal Silicide Formed by Laser Irradiation of Silicon Chip in Plating Solution," IBM Technical Disclosure Bulletin, vol. 26 No. 1, (List continued on next page.)

*Primary Examiner*—John Niebling
*Assistant Examiner*—William T. Leader
*Attorney, Agent, or Firm*—Steven J. Weissburg

[57] ABSTRACT

The invention is a method for making a metal containing article, comprising the steps of: providing a layer of a porous ground in a selected area; exposing selected regions of the layer of porous ground to light, thereby metallizing the selected regions; repeating the foregoing steps a selected number of times to produce a selected number of layers; and selectively modifying the metallized regions of the layers. The initial metallization can be by electroless or semiconductor photo deposition plating. The subsequent modification of the metallized regions can be by electroless plating, electroplating or sintering. It is also possible, in some instances, to forego the second phase modification, the initial phase having provided the desired parameters. In a third preferred embodiment, the invention is a method using an initial metallization phase effected by exposure of a metal salt, such as a metal halide, to light, thereby inducing activation of the halide. A subsequent metallization step is conducted, as well as subsequent modification according to any of the methods mentioned above. A continuous embodiment of the invention is also disclosed, where a continuously deposited bed of powder particles is exposed to light and metallized. Subsequently, the metallized regions are further modified as above. An apparatus for the practice of the continuous methods is also proposed.

32 Claims, 10 Drawing Sheets

OTHER PUBLICATIONS p. 327, Jun. 1983.

Andre M. T. P. van der Putten, Jan W. M. Jacobs, Jan M. G. Rikken, and Kees G. C. de Kort, "Laser–induced Metal Deposition from the Liquid Phase," SPIE (Society of Photo–Optical Instrumentation Engineers) vol. 1022, pp. 71–76, 1988.

J. S. Newman and W. Tiedemann, "Flow Through Porous Electrodes", in Advances in Electrochemistry and Electrochemical Engineering, vol. 11, ed. by H. Gerischer and C. W. Tobias, John Wiley and Sons, New York, 1978.

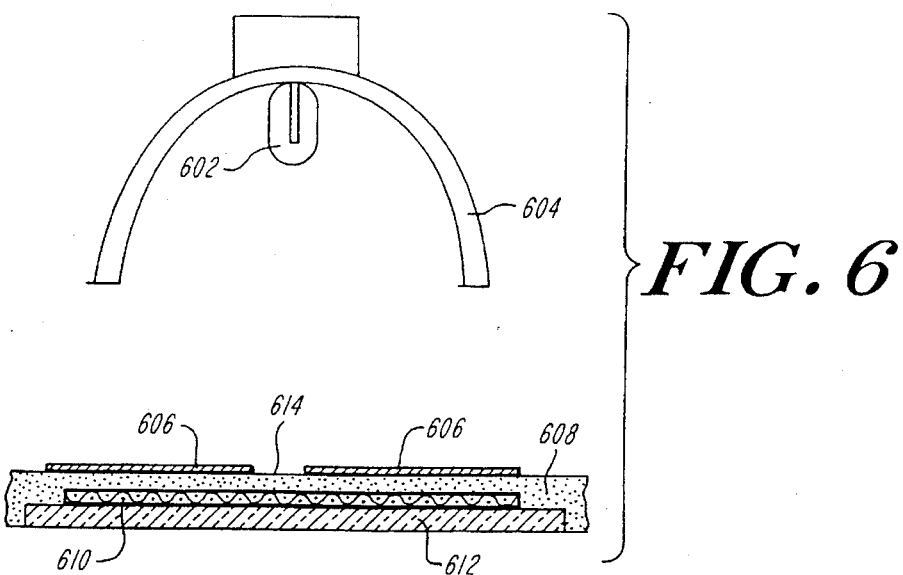
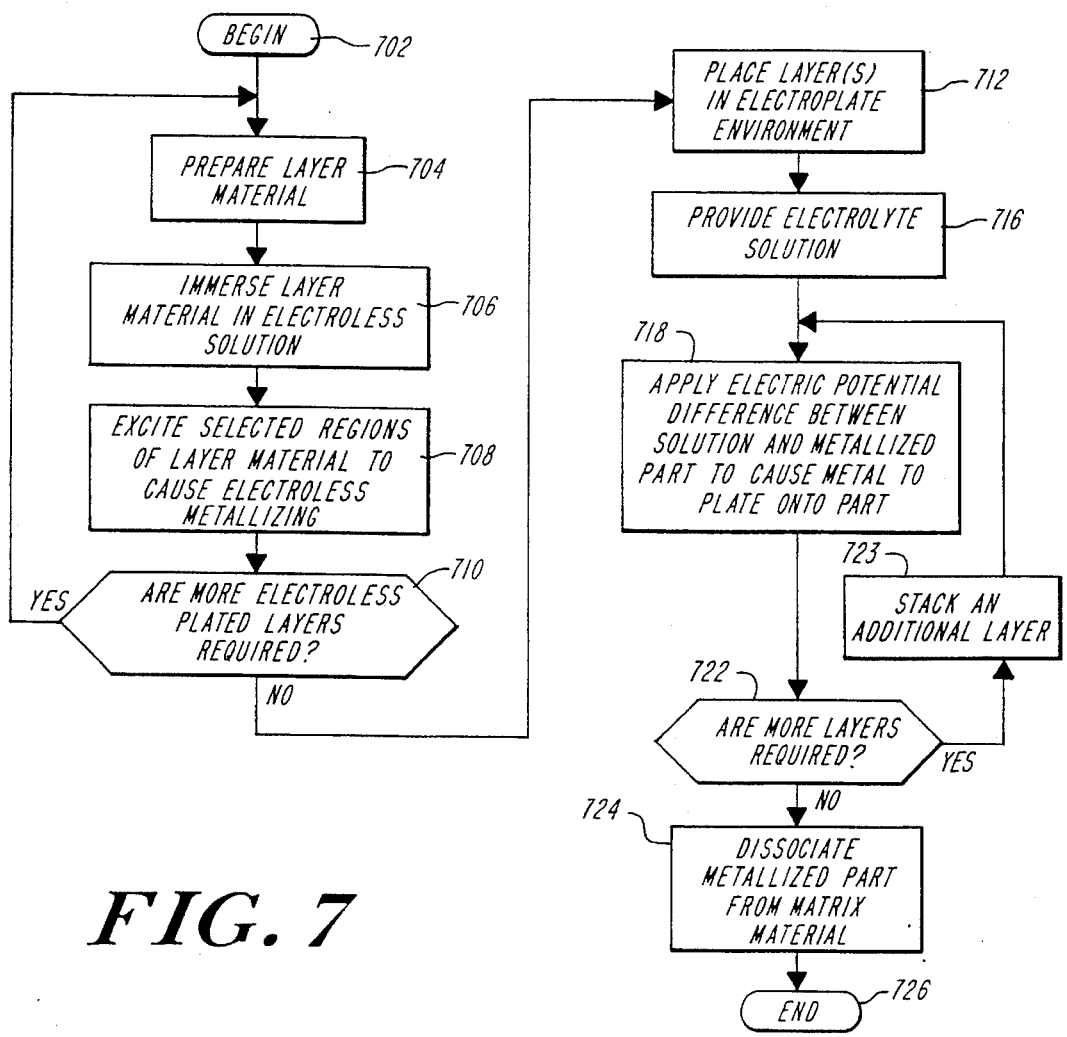
FIG. 6
FIG. 7

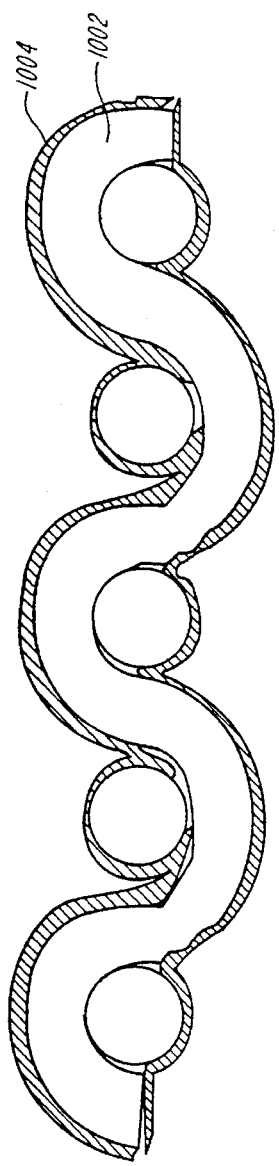
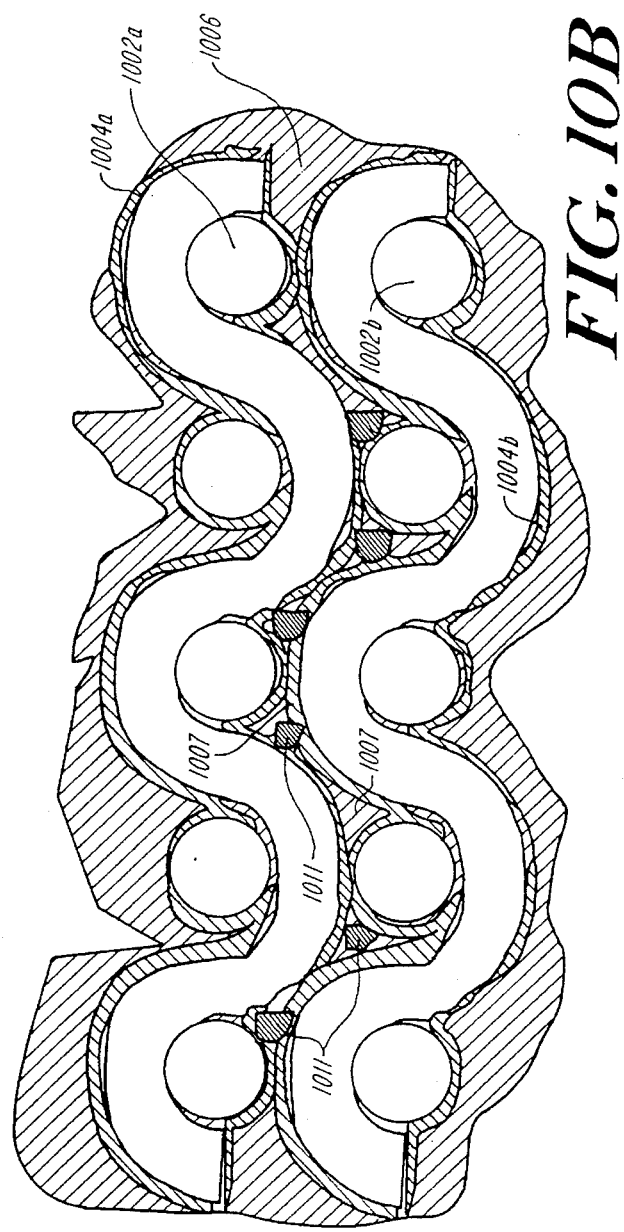
FIG. 10A
FIG. 10B

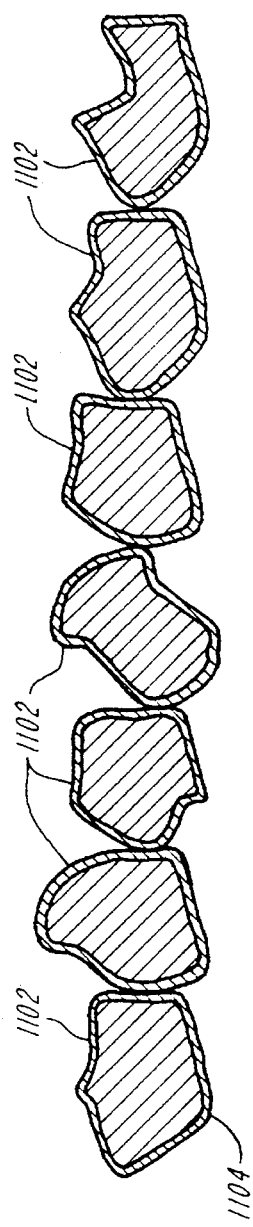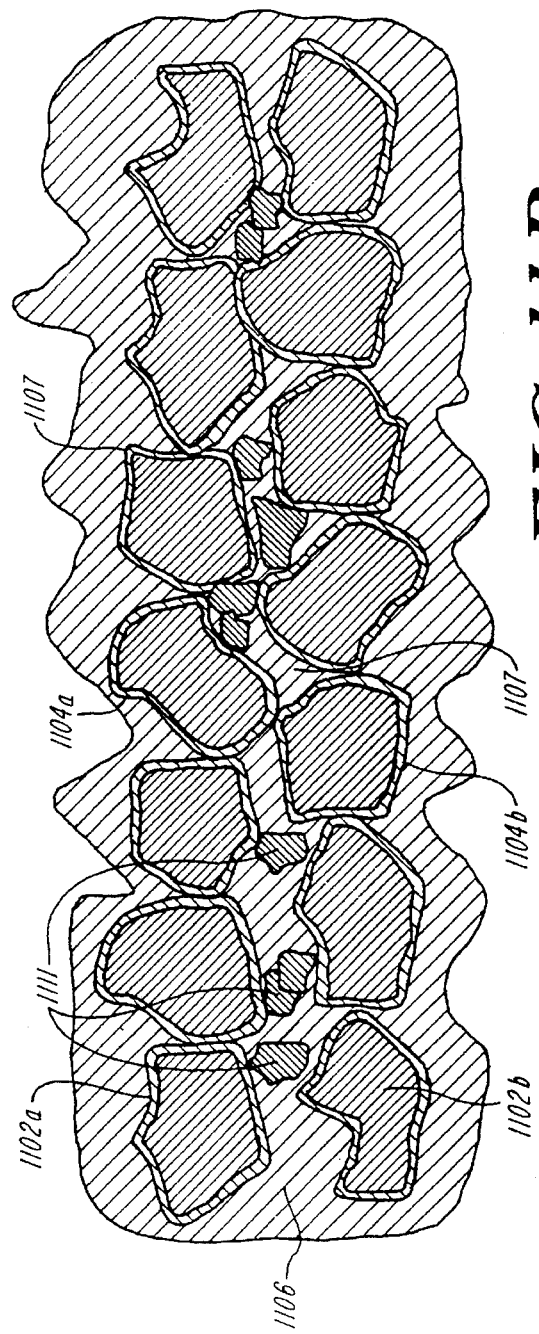
FIG. 11A
FIG. 11B

METHOD FOR PHOTO-FORMING SMALL SHAPED METAL CONTAINING ARTICLES FROM POROUS PRECURSORS

The invention relates generally to the field of manufacturing small mechanical parts. It relates in particular to the field of such "micro-manufacturing" using a photo-induced metal deposition on selected regions of a porous medium, followed by joining layers of the porous medium. One embodiment of the invention relates specifically to a method of and apparatus for defining geometries using light and electroless plating followed by electroplating to join the layers.

BACKGROUND OF THE INVENTION

Known techniques of micro-mechanical fabrication are primarily based on technology developed for integrated circuit fabrication. These known techniques can only form geometries of limited complexity. Bulk etching techniques usually suffer from limitations associated with crystallographic angles. H. Seidel, L. Csepregi, A. Heuberger, H. Baumgartel, "Anisotropic Etching of Crystalline Silicon in Alkaline Solutions," JOURNAL OF ELECTROCHEMICAL SOCIETY, vol. 137 no. 11 pp. 3612–3626, November 1990. Complex geometries can be fabricated by sequentially adding a layer of material, patterning it, and selectively removing portions of each layer. L. S. Fan, Y. C. Tai, and R. S. Muller, "Integrated Movable Micromechanical Structures for Sensors and Actuators", IEEE TRANSACTIONS ON ELECTRONIC DEVICES, vol. 35 no. 6 pp. 724–730, June 1988. N. C. Macdonald, L. Y. Chen, J. J. Yao, Z. L. Zhang, J. A. Mcmillan, and D. C. Thomas, "Selective Chemical Vapor Deposition of Tungsten for Microelectromechanical Structures," SENSORS AND ACTUATORS, vol. 20 pp. 123–133, 1989. However, because material must be removed from each layer after it is patterned, and because it may be necessary to planarize each layer, the number of steps involved may be quite high, thus rendering the cost and time for fabricating a part impractical for industrial purposes. For instance, using conventional methods to fabricate the structure shown in FIG. 1, having an overall width of approximately 550 μm and a thickness of 100 μm, fabrication must proceed in layers. It would be necessary to perform approximately 80 steps of chemical vapor deposition "CVD" patterning, etching, and planarization, if the thickness of each layer is 5 μm.

For fabricating larger mechanical parts (e.g. on the order of 1–100 cm, or, alternatively, having a minimum feature size on the order of 100–200 μm or greater in any dimension), there is currently significant interest in the field of "Desktop Manufacturing." See, M. Fallon, "Desktop Manufacturing Takes You from Art to Part", PLASTICS TECHNOLOGY, February 1989. Most so-called desktop manufacturing processes involve building a part in layers, where the geometry is defined by depositing a layer and then changing the properties of a selected portion of the layer. The term "desktop" is used because an operator at a computer terminal is provided with control over and information regarding every aspect of the manufacturing process, including the operational limits of various process steps.

Typically, multiple layers are added together on top of each other before the excess material is removed from each layer in one final combined step. Such a process can be described as "cumulative." All the layers are sequentially fabricated in the same machine. FIG. 2 schematically illustrates how the structure of FIG. 1 would be formed by such an approach. FIG. 2 includes six panels, showing the progressive steps for forming such a part. In the first panel 202 a layer 214 of material is established. The material is of a composition such that it has properties that can be selectively changed in different regions. Known techniques to selectively change properties include the following: three dimensional printing of a binder material to join layers of powder; laser solidification of photo-polymeriseable liquid polymer; laser sintering of powder; and laser fusing of thin layers of materials.

Three-dimensional printing uses ink-jet printing of a binder material to selectively join layers of powder to form parts. See generally, E. Sachs, M. Cima, J. Cornie, D. Brancazio, and A. Curodeau, "Three Dimensional Printing: Ceramic Tooling and Parts Directly from a CAD Model," National Rapid Prototyping Conference, Dayton, Ohio, June 4–5, 1990. Stereolithography, described in D. Deitz, "Stereolithography Automates Prototyping," MECHANICAL ENGINEERING, February 1990, pp. 34–39, uses an ultra-violet laser to solidify a bath of photopolymerizable liquid polymer on a selective, layer-by-layer basis to create solid polymeric parts. An alternative approach, called "Selective Laser Sintering," uses a laser to sinter areas of loosely compacted powder that is applied layer by layer. See generally, C. Deckard and J. Beaman, "Solid Freeform Fabrication and Selective Powder Sintering," in Proceedings NAMRAC Symposium #15.

After laying the material, the properties of the material in the first layer 214 are selectively changed 204 in specific regions 216. Next another layer 218 of material is applied 206 on top of layer 214. Next the material properties of selected regions of layer 218 are changed 208, as at panel 204.

These steps of layering and selectively altering properties are conducted repeatedly until a full block of material 222 is layered, as shown in panel 210. Captured within the block 222 is a region of altered properties, in the shape of a part desired to be fabricated. At panel 212, the material that makes up the surrounding body of block 222 is removed, such as by firing, and the region made up of the altered material remains, in the shape of the desired part.

To date, it has not been possible to apply such cumulative techniques to the field of micro-manufacturing, i.e. to the manufacture of complex geometries at sizes less than on the order of 100–200 μm. Further, all of the known techniques have drawbacks.

Several other techniques not traditionally connected with selectively altering the properties of a portion of an object are used in connection with the invention. These include: electroless plating; electroplating; sintering; photosensitive metal halide reduction; and photosensitive semiconductor applications.

Electroless plating is a well known process. It is described fully in Pearlstein, F., "Electroless Plating," *Modern Electroplating*, John Wiley & Sons, New York pp. 710–747 (1974), which is fully incorporated herein by reference. With electroless plating a continuous buildup of metal coating on a substrate arises by immersion in a suitable solution. A chemical reducing agent in the solution supplies electrons for converting metal ions in the solution to the elemental form. However, the reducing action occurs only on a catalytic surface. Thus, in order to continue building up metal on a surface, the metal already deposited must itself be catalytic. The plating occurs in the absence of an applied electric current.

Electroless plating has certain advantages over electroplating, which requires an applied electric current. The substrate need not be an electrical conductor, and regions can be selectively metallized, while other regions are left unmetallized. Power supplies and electrical contacts are not needed. Deposits are often less porous, are produced directly upon non-conductors and have unique chemical, mechanical or magnetic properties.

Electroless plating can be achieved using various metals known to the art, including nickel, copper, gold, silver, platinum, cobalt, palladium, and alloys of one or more of the foregoing.

In contrast to electroless plating, electroplating does require an applied electric potential difference, and thus an electric current between the object to be plated and the solution from which the metal ions are drawn. In electroplating, a substrate upon which metal is to be plated is placed in an electrolytic bath. An electrolytic bath is one having available negative metal ions for plating. By applying an electric potential between the bath and the substrate, with the anode or terminal in contact with the solution, ions are reduced in the solution and are plated onto the surface of the substrate, or the metal surfaces already plated.

A process known as electroforming has also long been known. Electroforming is described fully at F. L. Siegrist, "Have You Considered Electroforming?" METAL PROGRESS, October 1964, pp. 219–230, and F. L. Siegrist, "Electroforming with Nickel: A Versatile Production Technique," METAL PROGRESS, November 1964, pp. 121–130, both of which are incorporated herein by reference. According to this process, a mandrel or master form of predetermined shape, size, accuracy and finish is treated in an electroplating process so that metal is deposited thereon. After the required metal buildup, the mandrel is removed and the metal part remains. The mandrels can be expendable or reusable. Electroformed parts can be made from nickel, copper, silver, iron, gold, rhodium and chromium, depending on engineering requirements, such as electrical or thermal conductivity, optical reflectivity, strength, corrosion or wear resistance.

The reduction of a metal salt, for instance a metal halide, of which silver bromide is exemplary, after exposure to light, is the phenomenon underlying black and white film photography and is well known. A metal halide crystal that is exposed to light is activated, so that when later exposed to a developing solution, which is a chemical reducing agent, the metal is reduced to elemental metal and becomes opaque. Subsequently, the unactivated metal halide is dissolved away with a fixer, such as sodium hyposulphite. This process is well known in the art of photography. A concise description is provided in *The Way Things Work,* Simon and Shuster, pp. 200–201 (1967), which is incorporated herein by reference.

The semiconductor photo-deposition effect is also well known, and is described fully at M. S. Wrighton, P. T. Wolczanski, and A. B. Ellis, "Photoelectrolysis of Water by Irradiation of Platinized n-Type Semiconducting Metal Oxides," JOURNAL OF SOLID STATE CHEMISTRY, no. 22, pp. 17–19, 1977; Y. C. Kiang, J. R. Moulic, and J. Zahavi, "Metal Silicide Formed by Laser Irradiation of Silicon Chip in Plating Solution," IBM TECHNICAL DISCLOSURE BULLETIN, vol. 26 no. 1, pp. 327, June 1983; and Yu. V. Pleskov and Yu. Ya. Gurevich, SEMICONDUCTOR PHOTOELECTROCHEMISTRY, ch. 7 and 8, Consultant Bureau, New York, 1986 and H. Reiche, W. W. Dunn, and A. J. Bard, "Heterogeneous Photocatalytic and Photosynthetic Deposition of Copper on $TiO_2$ and $WO_3$ Powders," JOURNAL OF PHYSICAL CHEMISTRY, vol. 83, no. 17, 1979, pp. 2248, which are all incorporated herein fully by reference. If a body of semiconductor is attached to a body of suitable metal and immersed in an electrolyte solution, a beam of light focused onto the semiconductor, will give rise to a photocell between the semiconductor and the solution. Metal will be reduced from the solution to plate onto the semiconductor.

Another well known semiconductor photoelectric effect, used in connection with photocopying technology is useful in connection with the invention. The surface of the semiconductor nearest to the light source is provided with a large charge, as compared to the surface away from the light source. When the charged surface is struck by light, the resistance within the semiconductor markedly decreases, and current flows within the semiconductor. Charged toner particles in the vicinity of the dark side of the semiconductor are attracted to the conductor. The charge of the surface and particles can be arranged so that the particles are attracted to the locations on the dark side opposite those that were struck by the light or to the locations on the dark side opposite those that were not struck by the light. Other steps not relevant to the invention are used to transfer the charged toner to a recording medium, such as paper, whereupon they are fixed. This process is well known in the art of photocopying. A concise description is provided in *The Way Things Work,* Simon and Shuster pp. 198–199 (1967), which is incorporated herein by reference.

All of the known processes have drawbacks for micromanufacturing. Three characteristics are important: 1) geometries must be buildable with high resolution having dimensions as large as 10,000 μm but also having a resolution of less than 1–10 μm; 2) parts must be buildable from metal or ceramic, so that they are mechanically strong or electrically conductive or both; and 3) parts must be buildable relatively quickly. Stereolithography requires the use of expensive photopolymers and can not make parts from either metal or ceramic. Laser sintering is unable to make parts with the required small dimensions and high resolution. VLSI fabrication is a relatively slow process.

OBJECTS OF THE INVENTION

Thus, the several objects of the invention are to provide a method and an apparatus for fabricating three dimensional objects that: can produce very small parts with a minimum feature size on the order of 1–10 μm and an overall size of up to at least 10,000 μm; can be used to create parts of standard and useful types of materials such as metal, metal and ceramic composites or semiconductor; speedily produces parts of extremely complex shape and cross-section; that can create parts with smooth surfaces; can create parts with surfaces that have intentionally rough or patterned surfaces; can be operated fast enough and efficiently enough for industrial applications; does not require transferring the part being formed to different locations or different pieces of equipment during fabrication; that can be used to create parts used for complex multi-layer electronic packages, michromechanical parts, dies for molding operations, cutting tools and abrasive tools.

BRIEF DESCRIPTION OF THE INVENTION

In a first preferred embodiment, the invention is a method for making a metal containing article, comprising the steps of: providing a layer of a porous ground in a selected area; exposing selected regions of the layer of porous ground to light, thereby metallizing the selected regions; repeating the foregoing steps a selected number of times to produce a selected number of layers; and selectively modifying the metallized regions of the layers.

In a second preferred embodiment, the invention is a method for making a metal containing article, comprising the steps of: providing a layer of a porous ground in a selected area; contacting the porous ground with an electroless solution; exposing selected regions of the layer of porous ground to light, thereby metallizing said selected regions; and repeating the foregoing steps a selected number of times, each successive layer provided adjacent a layer that has already been formed, to produce a selected number of metallized layers, said metallization adding metal within said metallized regions of each individual layer and between said metallized regions of adjacent layers.

In a third preferred embodiment, the invention is a method for making a metal containing article, comprising the steps of: providing a layer of a porous, metal salt ground in a selected area; exposing selected regions of the layer of porous ground to light, thereby activating the selected regions; repeating the foregoing steps a selected number of times to produce a selected number of layers; metallizing said activated regions; and selectively modifying the metallized regions of said layers.

In a fourth preferred embodiment, the invention is a method for making a metal containing article, comprising the steps of: providing porous ground in a selected area; while the providing step is continuing, exposing selected regions of the porous ground to light, thereby metallizing the selected regions to a selected degree to a preselected depth; and selectively modifying the metallized regions of porous ground.

In a fifth preferred embodiment, the invention is a method for making a metal containing article, comprising the steps of: providing porous ground in a selected area; contacting the porous ground with an electroless solution; while the depositing step is continuing, exposing selected regions of the porous ground to light, thereby metallizing the selected regions to a preselected degree to a preselected depth.

In a sixth preferred embodiment, the invention is a method for making a metal containing article, comprising the steps of: providing porous metal salt ground in a selected area; while the providing step is continuing, exposing selected regions of the porous ground to light, thereby activating the selected regions to a preselected degree to a preselected depth; metallizing the selectively activated regions and selectively modifying the metallized regions of porous ground.

In a seventh preferred embodiment, the invention is a method for making a metal containing article, comprising the steps of: providing a layer of a porous ground in a selected area; contacting the porous ground to an electroless plating solution; and exposing selected regions of the layer of porous ground to light, thereby metallizing the selected regions.

In an eighth preferred embodiment, the invention is an apparatus for fabricating a metal article comprising: a pressure chamber having first and second pressure zones; a porous piston that divides the chamber between said first and second pressure zones; and a light transmitting window permitting transmission of light energy from outside the chamber to inside the chamber.

BRIEF DESCRIPTION OF THE FIGURES OF THE DRAWING

FIG. I shows schematically a very small and complex part of the type to be made according to the invention.

FIG. 6 shows schematically a cross-sectional view of a second preferred embodiment of the apparatus of the invention, using a photomask to make separate layers by electroless plating that are subsequently joined by electroplating.

FIG. 7 shows schematically in flow-chart form a second preferred embodiment of the method of the invention practiced in conjunction with the apparatus shown in FIG. 6.

FIG. 8b shows schematically a perspective view of a part formed by electroplating together a number of parts of the type shown in FIG. 8a.

FIG. 10a shows schematically a cross-sectional view of a portion of a porous screen electroless plated according to the method of the invention.

FIG. 10b shows schematically a cross-sectional view of a portion of a pair of porous screens electroless plated and electroplated together according to the method of the invention.

FIG. 11a shows schematically a cross-sectional view of a layer of porous particles electroless plated according to the method of the invention.

FIG. 11b shows schematically a cross-sectional view of a pair of layers of porous particles, each layer electroless plated and then electroplated together according to the method of the invention.

DETAILED DESCRIPTION OF PREFERRED EMBODIMENTS OF THE INVENTION

Figure 1:
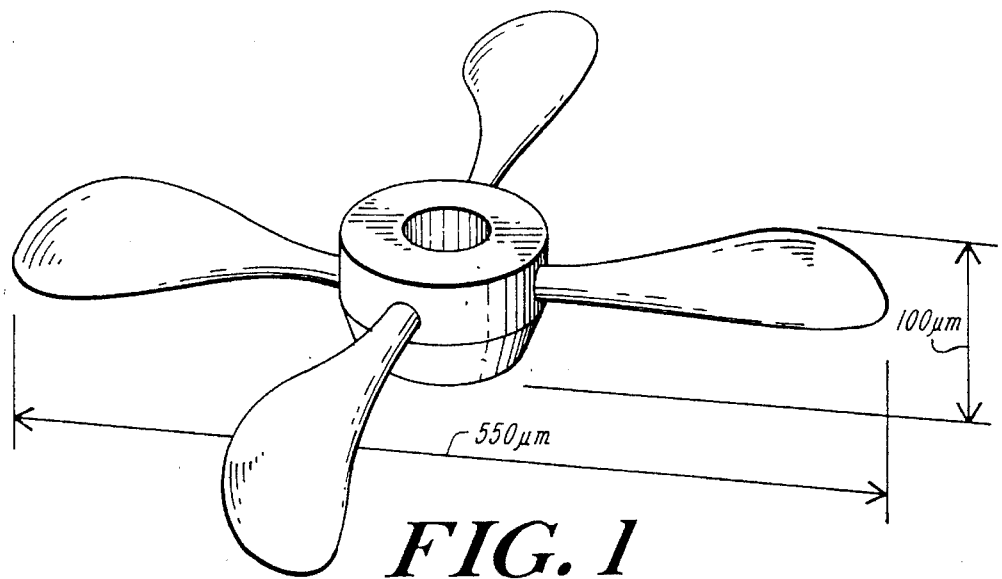

In the most general case of the invention, metal is selectively deposited upon a porous medium. The application of light induces the deposition. After individual levels have received a selectively located metal deposit, the levels are joined together. Thus, the generic method of the invention has two phases: a first photo induced selective metallization phase; and a second level (or depth-wise) joining phase. As is discussed below, there are at least three different techniques that can be exploited to accomplish the first phase, and three different techniques that can be exploited to accomplish the second phase. Any of the first phase techniques can be used with any of the second phase techniques (thus providing for at least nine combinations).

The invention can also be practiced according to three modes of building up a part. The first mode described is a discrete layer, in situ fabrication mode. The second mode described is a discrete layer ex situ mode. The third mode is a continuous powder deposition mode, similar to accumulating fallen snow. Any of the nine combinations of first and second phases can be practiced with any of the three modes of resolution. Thus providing for at least twenty-seven combinations.

The invention will first be described in connection with a generic embodiment that encompasses all of the techniques for accomplishing the first and second phases. A preferred embodiment of the method of the invention is illustrated in flowchart form in FIG. 4a. The process begins at 1402. The first step is to provide 1404 a quantity of a porous medium. The "figure" of the article being manufactured will arise from the "ground" of the porous medium, much of which may ultimately be discarded. Thus, the porous medium in general is referred to herein as a porous "ground." (It should be noted that the porous ground need not be composed of ground-up material. The term "ground" relates to the function of the porous medium, relative to the article being formed, not to its composition.)

After the article has been shaped, a quantity of the porous ground will remain having metal adhered thereto. Because this portion of the porous ground provides the initial structural strength of the article being formed, it is referred to herein as the "skeletal" medium, or the "skeleton" of the article. In some cases, it is possible and advantageous to remove the skeleton after the deposited metal has acquired additional strength. However, the name is apt due to the initial function of this component of the porous ground.

After a quantity of the porous ground has been provided, it must be placed in an appropriate environment for receiving light energy. In all embodiments of the invention, this environment includes a bath which must contact the selected regions of the porous ground in order for metallization to occur.

In the next step 1408, selected regions are excited by light energy, such as from a moving focused laser, or from a lamp that illuminates the ground through a mask. The light energy ultimately causes the metallization in regions where it has struck. As mentioned above, and as indicated in FIG. 4a at 1408, one of three different phenomena can be exploited to selectively metallize locations during the first phase of the invention. Either electroless plating 1408a or semiconductor plating 1408b or a metal salt (such as metal halide) metallization 1408c can be used. A more detailed explanation of the use of each of the different techniques is set out below.

Typically, if either the electroless or semi-conductor embodiments of the invention are employed, metallization occurs and then a subsequent layer of porous ground is provided, exposed to light energy and metallized. The end result is a pile of selectively metallized layers, which have been metallized individually. If the metal halide phenomenon is exploited, typically a layer is exposed to light, but not metallized. The next layer is provided (on top of the previous layer) and exposed to light energy. After the desired number of layers has been provided, the exposed regions of all layers are reduced to metal all at once.

In the first phase, there are also three different modes of building up the thickness of the article being formed. The modes are referred to below as " ex situ," "in situ" and "continuous." According to the ex situ mode, a number of discrete layers of porous ground are separately exposed to light energy at a first location, for instance in a first vessel, and then are brought and stacked together in one vessel for subsequent steps. Typically, the layers are also metallized at the first location, although, in the ex situ metal halide embodiment, metallization can occur after the layers are stacked and brought together. This ex situ method is indicated at $1408a_1$, $1408b_1$, and $1408c_1$. The name of the method derives from the fact that the layers are exposed to light outside (ex situ) of the vessel in which subsequent steps are conducted.

According to the in situ mode, indicated schematically at $1408_{a2}$, $1408_{b2}$ and $1408_{c2}$, the layers are exposed to light inside of the same vessel in which subsequent steps are conducted. A single discrete layer is exposed to light energy in a vessel. A second discrete layer is placed on top of the first, previously exposed layer, and the second layer is selectively exposed to light. Subsequent layers are provided until the entire article is built up. As in the ex situ method, with the electroless $1408_{a2}$ and semi-conductor $1408_{b2}$ methods, metallization of each layer occurs at virtually the same time as the exposure to light. However, with the metal halide method $1408_{c2}$, reduction to metal occurs at a time after exposure to light, when a developing solution is applied, typically after all of the layers have been built up.

Because the ground is porous, metallization of additional layers that have been deposited upon previous layers can occur, even with the in situ mode, because the solution that brings about the metallization, i.e. electroless solution in the electroless embodiment and electroplate solution in the semiconductor embodiment, can flow through the porosities in the porous ground and contact the spots that have been excited by the light energy. Thus, metal can plate on all surfaces of the ground that have been excited and that are in contact with the solution. The porosity must be great enough to permit sufficient flow of the metallizing solution to contact all locations desired to be metallized.

Similarly, with respect to the metal halide embodiment $1408_{c2}$, metallization takes place after all of the quantity of porous ground that will ultimately form the part has been exposed to light. The ground supporting the metal halide is porous, such as a powder, a powder cake, a gel or a metal halide impregnated plastic screen. Developing solution is provided to the chamber housing the stack of porous, excited metal halide ground layers. Because the stack is porous, the developing solution contacts substantially all of the spots that have been selectively exposed to light. The developing solution causes metal particles to reduce to metal and thus leaves a metal layer at the locations that were excited by the light. Thus, each layer will have a figure of silver metal surrounded by a ground of the original silver halide porous medium.

A third mode of build-up that can be used with each of the different techniques is a continuous mode, identified schematically at $1408_{a3}$, $1408_{b3}$, and $1408_{c3}$. According to this embodiment, porous ground particles are initially suspended in a fluid, like artificial snow in the well known winter scene novelty toys. Under controlled conditions, the ground particles fall from the solution and accumulate in layers, much like falling snow. The surface of the accumulating pile of porous ground is exposed to light, typically from a moving laser beam. As in the other embodiments, the light causes excitation, which, in conjunction with the appropriate fluid, brings about the selective metallization.

Once all of the quantity of ground has been metallized at selected locations, the first phase 1408 of the method of the invention is completed. According to a preferred embodiment of the invention, the process terminates at this point. This embodiment is useful where the desired properties, such as mechanical strength, electrical conductivity, etc., are achieved by virtue of the deposition of metal only through a first stage as described above. This procedure provides for very small and finely detailed components.

Many other preferred embodiments of the invention proceed beyond the first phase, and include a second phase.

According to the second phase 1424 of the method of the invention, it is advantageous to increase the structural integrity of the metallized regions within each layer, and also between adjacent layers. Typically, the structural integrity is enhanced by adding metal to the already metallized regions, both within a layer and between layers. The principal effect is to more strongly interconnect, or join the various metallized regions within a layer and between layers. Thus, the step is referred to principally below as a "joining" step.

However, it should also be noted that this step increases the structural integrity within a layer, which may already have been joined to a lesser degree. For instance, a porous sheet of particles that has already gone through the first phase will exhibit a degree of structural integrity, characterized by the surface area of contact points between particles, or some other suitable measure. After the "joining" step of the second phase, the amount of surface area of contact points between particles will have increased, because more metal will have filled in the gaps between the particles. Thus, the layer has become more interconnected, so joining of its various parts has taken place. Similarly, a mat (either woven or non-woven) becomes more interconnected and thus more joined, as metal is deposited on the already metallized fibers, thereby closing up the gaps between coated fibers. In addition to increasing the structural integrity within and between layers, the application of the second phase typically also increases the electrical conductivity within and between layers. This is because conductivity depends on the cross sectional area available for carrying current. As the area of contact points increases, the cross-sectional area typically increases.

As has been mentioned, there are several ways in which to join the levels of ground (either in discreet layers or in individual particles) including but not limited to electroplating, 1424d, electroless plating 1424e, and by sintering 1424f. An environment conducive to joining the layers is provided, typically in the same apparatus that was used to induce the selective metallization. For instance, if the method for joining the layers is by electroplating at 1424d, then electroplating solution is provided to a pile of metallized ground levels. Due to the porous nature of the ground, the electroplating solution can contact all surfaces that have been previously metallized. Similarly electroless plating can be used at 1424e, in which case, electroless plating solution is used.

Another method by which to join the levels in the pile is by sintering 1424f. The appropriate environment for sintering is characterized by an appropriate atmosphere, such as a permeating gas or fluid of a specific composition or even a vacuum, particular temperatures, etc. known to those or ordinary skill in the art.

If either electroplating or electroless plating is the method of joining, additional metal is plated around the metal layers already provided in the initial metallization phase, with typically a much thinner layer being added using electroless plating. If sintering is the method of joining, then typically no additional bulk is added to the article being made.

As is the case with the first phase, there are two principal modes of connecting the pile of ground used in connection with phase two. The adjacent levels can be joined all at once, after the entire porous ground pile has been formed (1424d₁, 1424e₁, 1424f₁) or level joining can take place at intervals during the build up of levels (1424d₂, 1424e₂). (The interval mode is typically not used with sintering.)

After the layers have been joined, the resultant product is typically a block of porous ground, which surrounds a continuous phase of plated metal, plated upon the skeletal portions of the porous ground. In some cases, the plated skeleton is dissociated from the ground at 1426. If the ground is a relatively loose powder, disassociation can be as simple as brushing or shaking away the powder to reveal the plated skeleton, formed from layers of plated portions of each layer. If the ground is a cake, or a mesh, disassociation is more involved, such as requiring burning away the ground using heat, or chemically removing the ground.

In some cases, rather than removing the ground, as at 1426, it is beneficial to further transform the ground at 1428, such as by impregnating the ground with a resin to give the ground cohesiveness and mechanical strength. Such a procedure might be used if the metallized portions were to be used as electrical circuitry, and the resin impregnated ground block were used to hold the components that operate through the circuitry.

At this stage, the article will be composed of a skeleton of ground (which may or may not be metal or a metal composite), surrounded by layers of metal. It may be desirable to disassociate the skeleton from the metal plated thereon. This optional step is indicated at 1438. Whether or not this is possible depends on the shape, the nature of the plating and the nature of the skeleton. Under certain conditions, skeletal material can diffuse through or dissolve into the plated metal layer. These options are discussed in more detail below.

The invention will now be discussed in connection with the discrete layer, in situ build-up mode, further specified due to the nature of the first and second phases. According to a first preferred specific embodiment of the invention, in the first phase of the process, an article is created by metallizing selective regions of a porous ground medium using electroless plating, and in the second phase it is further metallized using electroplating.

Figure 3:
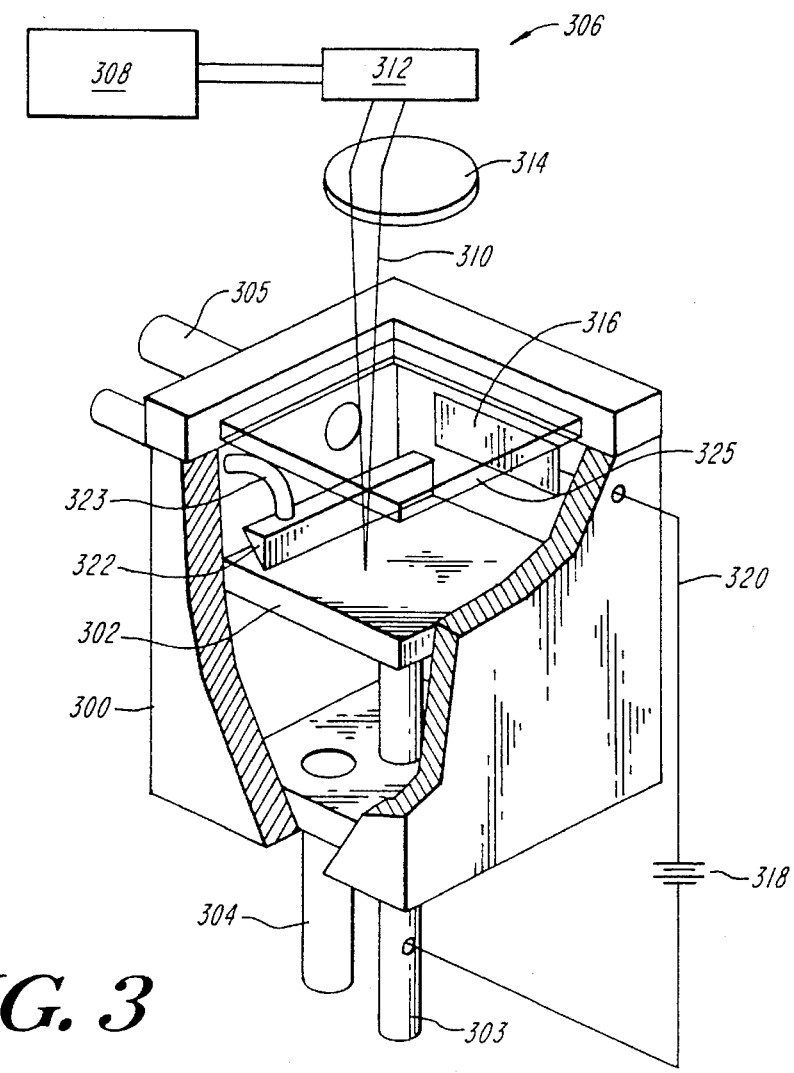
FIG. 3 shows schematically a cross-sectional view of a first preferred embodiment of the apparatus of the invention.
Figure 2:
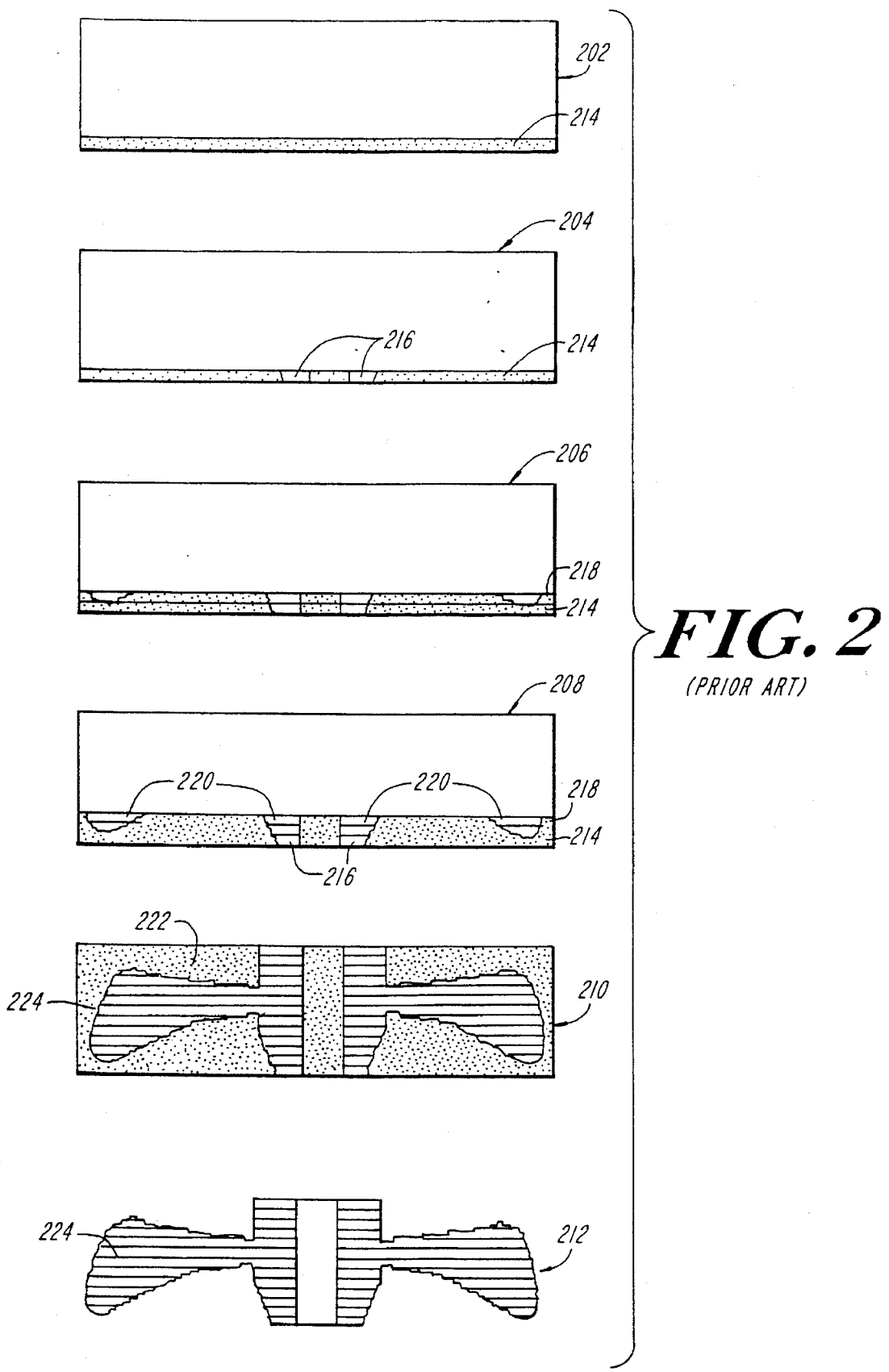
FIG. 2 shows schematically a generic cumulative manufacturing process known to the prior art.

A preferred embodiment of an apparatus of the invention is shown schematically in FIG. 3. All of the processing steps for this embodiment of the method of the invention can take place inside a pressurizeable vessel 300. A porous, electrically conductive baseplate 302 supported by a piston rod 303 divides the pressure chamber into two. Plating solution for the various processes of the invention are added to the chamber through port 305 and drawn from the chamber through port 304. A laser system 306 is shown schematically. The system consists of a laser 308, a laser beam delivery mechanism 312, and a flat field lens 314. The beam delivery mechanism scans the beam over the flat field lens such that focused laser beam 310 can strike any desired location on the base plate, or any parts built up upon the baseplate. The vertical position of the baseplate 302 can be controlled through actuating the piston rod 303 such that correct focusing can be maintained during the process. The end of the vessel 300 facing the laser must be provided with a high pressure proof, light transmitting window 325 so that light from the laser can enter the vessel. Such laser focusing apparatus are well known to those of ordinary skill in the art. The selection of the apparatus depends on the resolution required and the speed at which it would be required to move the laser. Both parameters are largely determined by the type of material from which the part is to be fabricated, and the size and shape of the part. One of ordinary skill in the art would know how to select an appropriate laser location system to satisfy the system requirements.

An anode 316 is positioned so that it can be brought into electrical contact with an electrolyte solution that is placed in the chamber 300 during the second phase of the method of the invention. The anode 316 is connected through electric circuit 320 to power supply 318 and the porous electrically conductive baseplate 302 through piston rod 303. (If the electroless method of metallization is used for the first phase, the porous baseplate need be conductive only if electroplating is used in the second phase of the method of the invention.) The power supply establishes an electrical potential difference between the anode 316 and the baseplate 302, to drive an electric current during the electroplating phase of the method of the invention.

Powder spreading apparatus 322, such as a doctor blade, is shown schematically. This apparatus must be able to spread layers of powder evenly over the entire surface of the base plate, at any desired thickness, for a single layer on the order of 5 µm to 200 µm thick. A roller device may also be suitable for spreading the powder. Typically, the powder is delivered to powder spreading apparatus through a hose 323 or similar line connected to a powder source (not shown).

Figure 4:
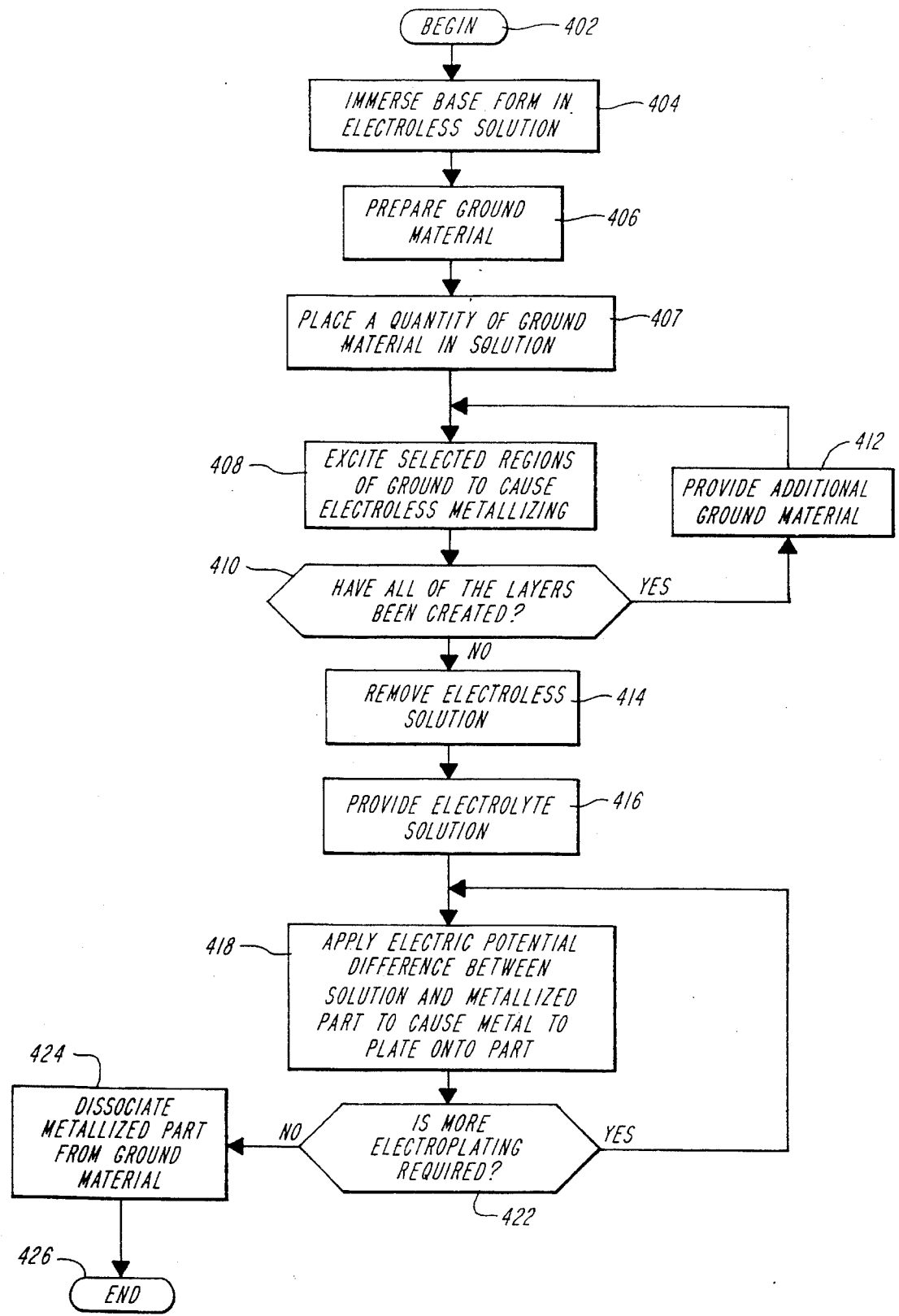
FIG. 4 shows schematically in flow-chart form a first preferred embodiment of the method of the invention.
Figure 5:
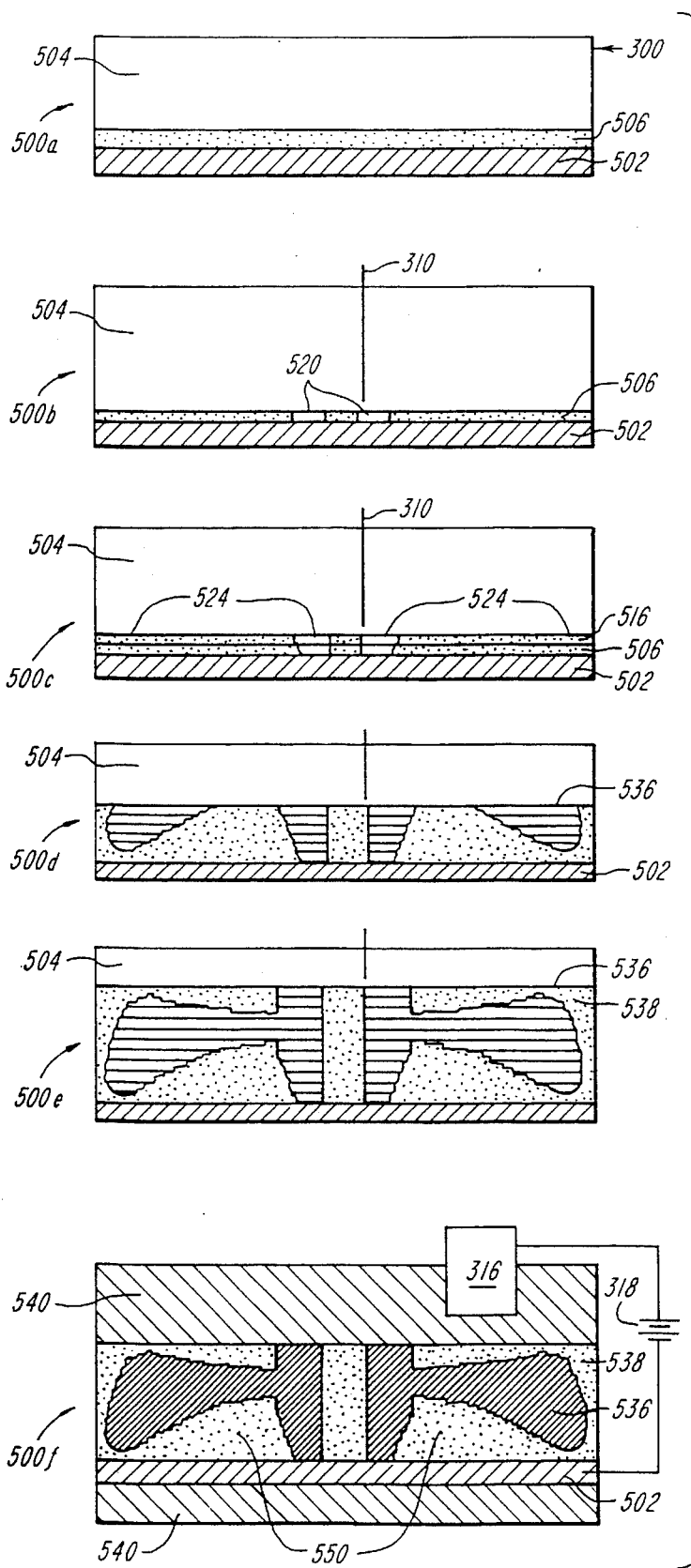
FIG. 5 shows schematically the fabrication of a part according to a first preferred embodiment of the method of the invention.

The steps of a preferred embodiment of the method of the invention using the electroless plating process for selective metallization of the first phase, and the electroplating process for layer joining of the second phase are shown schematically in FIG. 4. Several exemplary stages of a forming part fabricated according to the method of the invention are shown schematically in FIG. 5. The process starts at 402. The initial step is to provide a base plate. Although the baseplate 502 shown in FIG. 5 is planar, it need not be, and can be any shape which can be fixed in the pressure vessel 300 and upon which metal can be plated. Thus, it is also appropriate to refer to the base plate 502 as a "base form." As "base form" is the most general, it will be used throughout this description. The base form is porous, so that the electroless and the electroplating solutions can flow therethrough. It is electrically conductive, for reasons related to the electroplating embodiment of the layer joining phase of the invention.

The base form must be porous and of adequate strength to withstand the pressure differential applied across the base form during pumping of the various solutions required for practice of the invention. Suitable examples of a base form include a metal screen, a metal plate with small throughholes, layers of metal screens sintered together or, preferably, a plate made of sintered metal powder. An initially non-conductive porous material with suitable treatment can also be used as a base form. Such base forms include sintered ceramic material sensitized and activated by Pd/Sn (palladium/tin) chloride solution; sintered ceramic material covered with one layer of screen or a thin layer of silver powder.

At step 404 of FIG. 4, as shown in the top panel 500b of FIG. 5, the base form 502 is placed in a vessel such as 300 shown in FIG. 3 and electroless plating solution 504 is provided to completely cover and wet out the porous base form 502. The electroless plating solution is chosen based on the desired properties of the finished product. Solutions based on any of the metals identified above that are suitable for electroless plating are appropriate. Nickel plating solution, such as sold by Enthone, Inc. of New Haven, Conn., sold under the trade designation NI-429M Special, is suitable. The specification for this solution is at least 65% water, and less than 10% nickel sulfate, less than 15% sodium hypophosphite, less than 5% propionic acid and less than 5% acetic acid. At 407, a quantity of a non-conductive porous ground 506 is prepared. This ground is the material which will be energized and upon which the metal will be plated from the electroless solution. The ground is also porous, so that the electroless and electroplating solutions can pass therethrough. In the electroless plating phase, porosity permits flow of the solution, so that both the top and bottoms of layers can be plated. In the electroplate phase, the porosity permits plating throughout the body of the part, thereby evenly building up metal throughout the body of the part as it is fabricated. As has been mentioned above, the major portion of the powder is referred to as the "ground," while the portion of the powder upon which metal is actually plated is referred to as the "skeleton." Ground and skeleton material are initially identical.

Suitable candidates for ground include; 1) ceramic powder, such as alumina or silicon carbide; 2) a porous ceramic; 3) polymeric powder or a porous polymeric structure; 4) metal powder coated with a thin layer of non-conducting material.

The porous ground is prepared 406 by sensitizing it and activating it. Sensitization and activation is necessary pretreatment to electroless plate onto a non-conductive surface. In general, a small amount of metal is placed onto the surface. A suitable sensitizing agent is stannous (tin) chloride in dilute hydrochloric acid solution (such as is available from Transene Co. Inc., of Rowley, Mass., sold under trade designation sensitizer "solution C"). Activation replaces the tin with another metal, such as palladium. A suitable activation solution is palladium chloride in dilute hydrochloric acid solution (such as is available from Transene Co. Inc., sold under trade designation activator "solution D").

At 407, a quantity of the electrically non-conductive ground 506 is provided in contact with the base form 502. Typically, the ground material 506 is provided in a planar form, in substantially uniform layers. However, this is not necessary, and, depending on the shape of the part, the practitioner will understand the advantages of providing the ground material in forms other than planar layers.

Electroless metallization of the ground is shown schematically in panel 500b. A light beam 310 is shown schematically. The light beam can be provided by a focused laser, as shown schematically in FIG. 3. Alternatively, as discussed below, if an optical mask is used, the light beam can be produced by a less directed source, such as a Tungsten halogen bulb with an aluminum reflector. The exposure can be made at the focal distance of the light source for maximum intensity, or at some other distance if maximum intensity is not required.

The light from the light source, for instance a laser, strikes the ground at preselected locations 520 over the surface of the layer. As is known, a focused laser beam can induce selective metallization by electroless plating with fine resolution. See generally Andre M. T. P. van der Putten, Jan W. M. Jacobs, Jan M. G. Rikken, and Kees G. C. de Kort, "Laser-induced Metal Deposition from the Liquid Phase," SPIE (Society of Photo-Optical Instrumentation Engineers) vol. 1022, pp. 71–76, 1988. The light source heats the ground, such that the ground becomes excited to the energy level required for the metal ions in the electroless solution to be reduced and to metallize the surfaces of the ground that are both heated the required amount and in contact with electroless solution. This step is indicated at 408 in FIG. 4.

The mechanism by which the light beam is believed to cause electroless plating is that the light heats up the ground, bringing it to a required level of excitation. This is to be distinguished from the mechanisms by which light causes metallization in both the semi-conductor and metal halide embodiments discussed below. In each of the latter, it is the interaction of photons with the ground that causes the excitation, not simply the heating due to the heat energy embodied by the beam of light.

Because the ground is porous, the surfaces bounding the spaces throughout the ground will be in contact with electroless solution. Thus, a network of metal will be deposited on the surfaces of the porous ground. If, for example, the ground is a powder, then the outside surfaces of individual powder particles are metallized. The metallization extends to that depth in the ground where the combination of the ground and adjacent liquid was heated sufficiently to reach the required level of heating. Heat transfer also causes a spreading of the area where metallization will occur. Thus, metallization is not limited only to those regions that are struck by the light beam, but can extend to other regions in the part being formed.

The body of the part will be made up of metal that has been deposited on the porous ground, and on the layers of metal that have been deposited on top of each other. Therefore, the porosity of the finished part will, to some extent, depend upon the porosity of the ground.

The duration of the energizing step depends on many factors, including the power of the light source, diameter of the laser beam (if used), the desired depth of metallization, the substance of the ground and the electroless solution.

The time for metallization can be decreased by using a "rapid scanning" technique that is possible because the rate at which the ground heats up is greater than the rate at which it cools down. Thus, plating can continue at a spot for some time after the beam has moved away. The cooling time constant is several times that of the heating time constant. Thus, a properly adjusted scanning speed can increase the rate of metallization several times.

After the first layer of ground has been excited at 408 to cause electroless metallizing, it is determined at 410 whether all of the necessary layers have been created. Typically, more than one layer is required. For instance in the example shown in FIG. 5, many layers are required. As shown in the next panel 500c, after the first heating step, an additional layer 516 of ground is deposited 412 on top of the first layer. Typically, the second layer is of the same material as the first, however it need not be. Thus, if it is required to precisely control the nature of the ground, this can be done.

Additional layers can be applied by spreading a powder using a moving, counter rotating roller (i.e. a roller which is moved forward, while it rotates in the direction opposite to that it would rotate if it were rolling forward), which pushes a pile of powder in front of it. Alternatively, a doctor blade can be used to spread powder. Alternatively, a discrete layer in the form of a cake or a screen, etc. can be placed on top of the preceding layer(s).

The method of the invention again entails the excitation at 408 of selected regions of the newly added layer 516, those regions 524 chosen as is required due to the geometry of the article being built. Again, due to the excitation, metal ions are reduced and bond to the porous ground (which thus becomes the skeleton material) that makes up layer 516.

As is shown schematically in FIG. 5, each layer provides a new "step" in the growing part. If examined very closely, the texture of the built up layers is typically noticeable, causing a step-like surface. The coarseness of the steps and thus the resolution of the part, depends on the thickness of the layers. Thinner layers produces a finer finish; thicker layers produces a coarser finish. Typically, using a ground of powder spread in discrete layers, the thickness of the layer can be as small as the largest particle size in the powder being spread. Thus, layers of between five and two hundred m thickness, preferably between five and fifty µm, can be used with satisfactory results. One of the advantages of the method of the invention is that it can accommodate very fine powders, because the powder is being spread within a liquid. Dry spread powder is highly susceptible to adhesion and thus, small powder particles cannot easily be spread. Powder spread in liquid is not so highly adhesive. Thus, powder having a minimum particle size on the order of between 0.2 and 5.0 µm and preferably between 0.2 and 2.0 µm can be used to achieve the layer thickness of between five and two hundred µm mentioned above.

The process of electroless plating is repeated as many times as is required to produce the shape of the piece to be manufactured. Because there will be additional plating using an electrolytic process (if that method is used to join the layers), the shape of the part formed by electroless plating is not exactly the same as the desired finished part.

The electroless plating solution may be the same throughout the buildup of all of the layers for the part. However, this need not be the case. Thus, if it is desired to fabricate a part that is a sandwich of one metal between two layers of a different type of metal, then after application of the first type of metal, the first electroless solution can be removed, or altered, while the growing part remains in the vessel 300. A different type of electroless plating solution can be added to the chamber, and the ground can be selectively energized so as to metallize selected regions with the second type of metal. Next, the second type of electroless solution is removed, and another type, which may be the first type in the case of a sandwich, is introduced. The ground is again energized, and the new type of metal is deposited as an additional layer. As has been mentioned above, it is also possible to add a different type of ground from one layer to the next. Thus, great flexibility in composition can be achieved. Typically, even if different metals are used in the electroless plating phase, the electroplating phase deposits the same metal everywhere.

Panel 500d shows an exemplary intermediary stage of this embodiment of the process, where the growing part 536 is about one-half completed.

If at 410 it is determined that no additional electroless plating is required, the situation is as shown schematically in panel 500e of FIG. 5. The fully formed electroless part 536 is embedded within a block 538 of ground. The inter-layer integrity of the ground is typically rather loose. If the ground is a powder, then other than at locations where electroless plating has occurred, there will be virtually no inter layer adhesion or integrity. At 414, the electroless solution is removed from the vessel 300 by an appropriate mechanism, for instance drain port 304 as shown in FIG. 3.

It is beneficial to remove any hydrogen bubbles generated during the electroless reaction. To this end, it is beneficial to reduce the gas content of the solution before the process is begun, so that the solution has the capacity to accept as much hydrogen as possible during the process. Then, the bubbles can be removed by dissolving them in the solution or transporting them away by the fluid which is flowing through the powder bed, or a combination of the dissolution and transport. It is also helpful to maintain an elevated pressure, of up to about 100 atmospheres, preferably above five atmospheres, which keeps the gas in solution, minimizing gas bubble formation.

Operating at elevated pressure provides several other advantages, in addition to allowing more hydrogen gas to be dissolved in the solution. Elevated pressure allows more fluid to be pumped through the porous ground. The elevated pressure also raises the boiling point of the solution so that the typical operating range of the apparatus does not include the boiling point.

A portion of an article fabricated according to one embodiment of the invention is shown schematically in cross-section in FIGS. 11a and 11b. FIG. 11a shows a layer of porous, electrically non-conductive particles 1102, which acts as the ground. Surrounding the layer 1102 is a thin layer 1104 of electroless plated metal, for instance, nickel. As can be seen, the metal substantially contacts all surfaces of the particles 1102, the thickness of the layer being on the order of 1,000 Å. Typically, the electroless plated metal does not fully fill up all of the interstices between the particles and thus, the plated assembly remains porous to a significant degree.

Although electroless plating is possible, in general, with a large number of different metals, as set forth above, for use with the present invention, the metal must be one which can be electroless plated by photo induction. The invention, as claimed, is intended to apply to all metals which can be induced to electroless plate using the thermal energy carried by light.

The foregoing discussion has generally focused on a ground in the form of powder or particles, or cakes or sintered sheets of the same. As has been mentioned, it is also beneficial to use a screen, such as a woven or a non-woven nylon screen, as the ground. A portion of an article fabricated according to the invention using a woven screen ground is shown schematically in cross-section in FIGS. 10a and 10b. FIG. 10a shows a porous, electrically non-conductive screen 1002, which acts as the ground. Surrounding the fibers of screen 1002 is a thin layer 1004 (on the order of 1,000 Å thick) of electroless plated metal, for instance, nickel. As can be seen, the metal substantially contacts all of each surface of the screen 1002, but leaves openings between solid elements of the screen. Thus, the plated assembly remains porous to a significant degree. Due to this continuing porosity, the electrolyte solution can pass through the entire body of the electroless plated assembly of ground, thereby ensuring full electroplating throughout.

Continuing with the embodiment of the invention using electroless plating for the selective metallization first phase and electroplating for the second phase to join layers together shown in flowchart form in FIG. 4, after the electroless solution is removed, an electrolyte solution 540 is added at 416. Because the block of ground is porous, as is the base form 502 and the electroless plated part 536, the electrolyte solution can penetrate through each of these structures, thereby contacting the outside surface of the formed part 536, as well as much of the surfaces within the body of the part between the metallized porous particles. A suitable electrolyte solution is a Watts type bath, such as SEL-REX LECTRO-NIC 10-03, sold by OMI International Corp. of Nutley, N.J. The specification of this bath is 300 g/l of nickel sulfate; 40.5 g/l of boric acid; 63 cc/l anode activator; and 2.2 g/l of stress reducer. Typically, the viscosity of the fluid is on the order of the viscosity of water. Substantial pressures are necessary to sustain the flow through a thick bed of fine powder.

An electric potential difference is provided between the electrolyte solution 540 and the metallized part 536. Power supply 318 supplies the potential difference across its terminals. One side is in electrical contact with anode 316, which is in electrical contact with the electrolyte solution 540. The other side of power source 318 is in electrical contact with electrically conducting base form 502, which is in electrical contact with the formed metallized part 536. When the circuit is closed, the potential difference between the solution and the metal part causes metal ions to be reduced and to plate onto the surfaces with which the solution is in contact. Thus, wherever the solution contacts the metallized part (which is where current is flowing), metal will be plated.

As shown in FIG. 11b, two layers of electroless plated particle ground layers as shown in FIG. 11a are electroplated together. One layer, made up of particles 1102a and electroless plating 1104a is joined through electroplating layer 1102a to the second layer made up of particles 1102b and electroless plating 1104b. It is necessary that some locations of electroless plated metal from each individual powder granule touch an electroless plated location on other particles, so that current can flow through the entire body of powder, thus enabling electroplating throughout. Not only is the electroplated metal sandwiched between the two layers and applied to the outer surfaces of the layers, but it actually extends into the body of each, for instance at 1107. Thus, the layers of the part are very strongly united. The porosity of the initial base form and the continued porosity of the electroless plated article being formed facilitates both electroless and electroplating. A given volume of plating liquid has relatively little metal material in solution and thus will be depleted quickly. Thus, if the fluid around a locus is substantially stationary, the degree of plating is sharply limited by the limited mount of material in the nearby region of liquid. However, if the liquid is moving, more material becomes available for deposition. The porosity of the base form and the forming part allows for flow of the solution through the forming part, thereby bringing material to be plated into the interior of the part, from regions outside of the part. The finished product will typically also include voids, such as 1111. As more and more metal builds up, certain regions will become inaccessible to fluid, and thus metal plating will stop.

As shown in FIG. 10b, two layers of electroless plated screen ground are electroplated together. One layer, made up of screen 1002a and electroless plating 1004a is joined through electroplating layer 1006 to the second layer made up of screen 1002b and electroless plating 1004b. As with the powder, it is necessary that some locations of electroless plated metal from each screen touch an electroless plated location on adjacent screens, so that current can flow through the entire screen network, thus enabling electroplating throughout. Not only is the electroplated metal sandwiched between the two layers, but it actually extends into the body of each, for instance at 1007. Thus, the layers of the part are very strongly united. As in the case of individual particles, discussed above, there will be some voids 1011 where no plating takes place.

Figure 4A:
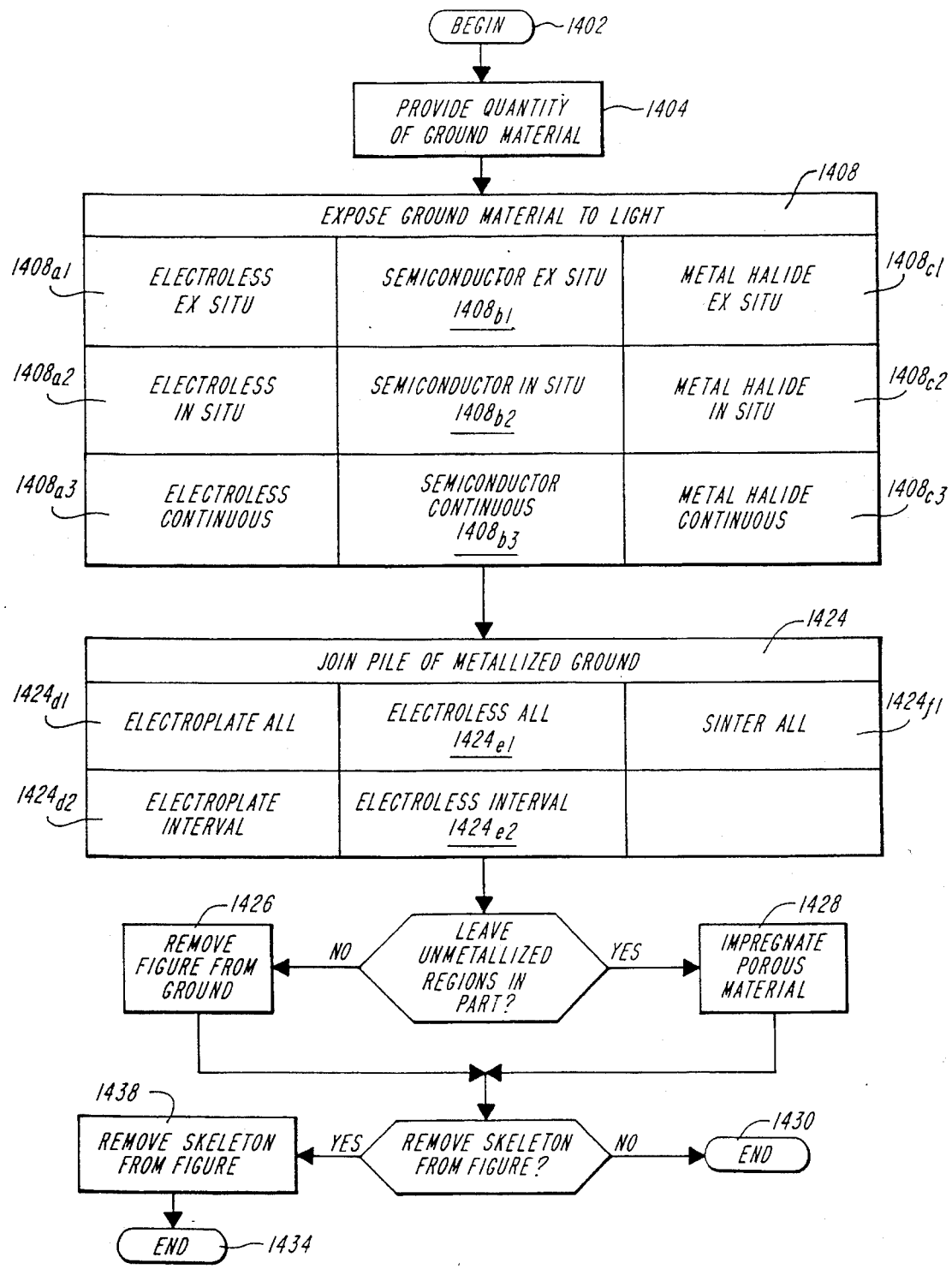
FIG. 4a shows schematically in flow-chart form a generic embodiment of the method of the invention.

As stated in connection with FIG. 4a, it is possible to connect the already metallized layers together using electroplating, by either electroplating all layers together at one time, or by electroplating smaller sets of layers together at intervals throughout an extended layer build-up procedure. In general, it is easier to control the accumulation of electroplated material in the direction of buildup if all of the layers are brought into contact in the intended final form, and then electroplated together. Otherwise, each subset made at an interval would have two end layers, which would be electroplated on both sides, but which would contact an additional layer only on the inner side. It would thus be more difficult to control the thickness of the deposition of electroplated metal between layers that were once end pieces during electroplating of a subassembly, as compared to the thickness of the deposition between layers that were never end pieces during a subassembly.

Electroplating is a well developed art. Those of ordinary skill in the art will readily understand how to alter the current density through the part to increase or decrease the rate of deposition of metal. It is also well understood how the shape of the form for the electroplating affects the rates of buildup. In this case, the form is the part metallized by electroless forming. In general, it is important to produce an electroplated deposition as nearly uniform as possible, even deep within the part. The fact that the fluid becomes depleted as it passes into the part and material is plated out onto the regions closer to the surface necessitates special handling to achieve this goal. One method is to use a relatively high flow of solution coupled with a relatively low plating current. This will result in a lower rate of plating, so that more material will be left in the fluid when it arrives at the internal locations.

In this case, the porous ground behaves as a porous cathode. Those of ordinary skill in the art are familiar with plating using such cathodes from the recovery or removal of metal ions from waste process streams. See generally, J. S. Newman and W. Tiedemann, "Flow-Through Porous Electrodes", in ADVANCES IN ELECTROCHEMISTRY AND ELECTROCHEMICAL ENGINEERING, vol. 11, ed. by H. Gerischer and C. W. Tobias, John Wiley and Sons, New York, 1978; and J. R. Selman and C. Y. Yuh, "Current Distribution in Flow-Through Electrodes during Electrodeposition", in PROCEEDINGS OF THE SYMPOSIUM ON ELECTROPLATING ENGINEERING AND WASTE RECYCLE NEW DEVELOPMENTS AND TRENDS, ed. by D. D Synder et al., The Electrochemical Society Inc., Pennington, N.J., 1982, both of which are incorporated herein by reference.

Two major parameters to be controlled in the flow-through plating process are solution flow rate and plating current density. Solution flow rate affects the variation and distribution of ion concentration, and current density affects the quality and time of electroplating. For laminar flow, the flow rate through a porous structure is governed by the following relation:

$$\Delta p = 4.2 \frac{\mu v L s^2}{A \epsilon^3},$$

where $\Delta p$ is the dynamic pressure difference across the porous structure, $\xi$ is porosity, $\mu$ is viscosity, $v$ is volume flow rate, $s$ is specific area, $L$ is bed depth, which corresponds to the thickness of a layer of porous ground, and $A$ is bed cross-sectional area, which corresponds to the surface area of the porous ground. See, Newman 1978, cited above. Therefore, the flow rate can be controlled by regulating the pressure difference from one side of the porous ground to the other.

Assuming 100% current efficiency, the relation between ion concentration variation and average plating current density can be found, by balancing the charges, as, $$(C_i - C_0)v = \frac{MsALj}{nF},$$

where $C_i$ is the ion concentration of the solution flowing into the porous ground, $C_o$ is the ion concentration of the solution flowing out of the porous ground, M is the atomic weight of deposited metal, n is the number of electrons transferred in the reaction, F is Faraday's constant, 96487 (C/equiv) and j is the average current density (A/cm$^2$).

Due to the solution resistance inside the porous powder bed, the polarization across the powder bed is usually not uniform and thus the current density distribution is not uniform either. Increasing flow rate and reducing current density can improve the distribution of metal deposition rate. As an example, to join a powder bed of 100 cm$^2$ area and 0.4 cm thick consisting of 5 µm particles by copper plating requires about five hours at a current of 340 A, assuming the average current density on each particle is 0.001 A/cm$^2$ and 0.5 µm coating on each particle is sufficient to join the particles. If a pressure difference of 320 psi is applied across the powder bed, a flow rate of 0.53 ml/sec can be obtained and this results in about 1% consumption of the ion concentration of the electrolyte. The high current value used in this example would be sufficient to join the whole ground bed into one block. The actual volume to be joined in a practical manufacturing setting, i.e. that portion which will make up the article being formed, will only be a small fraction, about several percent, of the total volume. Thus, much less current is required.

If it is determined at 422 that more electroplating is required, the potential difference continues to be applied, and more metal is plated onto the surfaces contacting the solution. If no more electroplating is required, the electroplating is terminated. For typical parameters, for instance, a screen that is initially 160 µm thick, adjacent layers will be joined if 20 µm additional metal is plated at a current density of 0.02 Amps/cm$^2$. The actual deposition thickness required to join layers depends on the layer thickness and strength requirements.

At 424, the formed metal part (the metal plated skeleton) is dissociated from the surrounding ground. This is analogous to step 1426 in the generic process of the invention shown in FIG. 4a. (This step is optional, as indicated in FIG. 4a. It may be desirable to retain the ground, and transform it by impregnating it with resin or some other structural material.) There are many ways to remove the ground, depending on the type of ground and plated metal. If the ground is a powder, typically it will not be adhered to the metal part and can be simply removed.

If the ground is more strongly adhered to the metallized part, for instance if a continuous network such as a nylon screen or other porous plastic sheet has been used for each or any of the layers, then the non-metallized portions can be removed by heating the entire block of ground to a temperature between the combustion point of the ground and the melting point of the metal. For instance, a nickel part formed from an electroless plating solution and an electrolyte solution formed on a nylon screen ground can be dissociated from the unplated nylon ground by firing the entire assembly at 500° C. in air to burn away the unplated nylon. This step can be carried out in the same vessel 300 in which the plating takes place, or in a different environment.

Alternatively, chemical methods can be used to remove the ground from the part. For instance, a plastic screen can be dissolved in solvents. If the porous ground is silica, it can be etched away in a bath of hot NaOH (sodium hydroxide) without etching a nickel plated structure. The part is now complete, having been formed according to one embodiment (electroless plating followed by electroplating) of the method of the invention.

The portion of the ground that is removed according to the steps just described are typically distinct from the skeleton, upon which the metal has been plated. For instance, as shown in FIG. 4, step 424 those portions identified by reference numeral 550 in FIG. 5 will be removed. However, those portions plated with metal, such as the portion of the screen 1002 shown in FIG. 10, or the powder particles 1102 shown in FIG. 11, will remain.

If it is desired to dissociate the skeleton from the plated metal, analogous to step 1438 shown in FIG. 4a, additional steps must be taken, and the choice of skeleton material and metal must be made to accommodate this step. Basically, the skeleton can be of a composition so that it (or a component thereof) can diffuse through the plated metal, so that it can be removed from the outside. Alternatively, the skeleton can be of a material that will dissolve into the plated metal. This diffusion or dissolution may also take place under the influence of added agents, which themselves diffuse through the metal plate to react with the skeleton or components thereof. Oxygen is an example of such an added agent, which diffuses through the metal plating to burn out an organic skeleton, such as a plastic.

Another embodiment of the invention that is closely related to the embodiment just discussed, uses flow through electroless plating, rather than electroplating for the second phase to join the layers together. This is indicated at FIG. 4a at 1424e. This stage of electroless plating need not be photo-induceable, since it is not necessary to precisely identify the locations where plating will occur, those locations having already been identified and metallized in the first electroless phase. Thus, metals can be used for this layer joining phase of electroless plating even if they are not photo inducible. Typically, a different electroless plating solution, either of a different concentration, or a different metallic composition will be used. Electroless plating solution at elevated temperature can be pumped to flow by the porous ground. The previously applied metal on the skeleton acts as a catalytic surface to induce further electroless metal deposition until the skeleton is completely joined into an integral part from one layer to the next.

If electroless plating has been used as the selective metallization method in the first phase, as indicated at 1408a in FIG. 4a, then the unmetallized ground, which had been pretreated or "activated" so that it would metallize if exposed to light, would continue to accept metal when touched by heated electroless plating solution during the second phase, as shown at 1424e. Therefore, steps must be taken to insure that those regions are no longer activated, so that they are not metallized in the layer joining phase of the invention. A highly diluted acid solution, e.g. nitric acid solution, can be pumped to flow through the porous ground layers to etch the catalytic surface away before starting the second phase of joining the layers at 1424. The diluted solution should be selected so that it has only a negligible effect on the metallized portion of the ground material.

Whether or not it will be appropriate to use electroless plating to join the layers will depend on the required strength and size of the article to be made. In general, it is not possible to achieve as much strength and thickness from electroless plating as is possible from electroplating. However, where strength and size are not paramount considerations, joining by electroless methods may be appropriate.

As has also been mentioned, in the second phase, the layers can also be joined by sintering in an appropriate atmosphere, as indicated at 1424f in FIG. 4a. To sinter adjacent levels to each other, the pile of levels is heated to a required temperature, as is readily determined by those of ordinary skill in the art, in an appropriate atmosphere under appropriate pressure. Metal atoms from one layer actually move to the adjacent layer, and vice versa, thus providing for a structural connection between the two adjacent layers. It is well known to those of ordinary skill in the sintering art that certain metals act as "sintering aids," and greatly promote the speed of sintering. See German, R. M., POWDER INJECTION MOLDING, Metal Powder Industries Federation, Princeton, N.J. pp. 376–378 (1990).

During the first phase of the method, rather than using electroless plating to establish the pattern of selective metallization, any method of selective metallization induced by light energy can be used and is contemplated as a part of the invention. One additional exemplary mode entails the use of metal salt particles, such as the family of metal halides, of which an exemplary member is silver bromide. Another entails the use of photosensitive semiconductors.

According to the method using metal salt, such as metal halide, indicated at 1408c in FIG. 4a, the ground is provided with a quantity of metal halide throughout. The metal halide can be provided in a form similar to normal photographic paper, with a porous paper base layer, covered with an emulsion of metal halide, typically suspended in a gel binder. Alternatively, a woven or non-woven screen can be coated with a thin layer of metal halide in a gel emulsion. As yet another alternative, ceramic particles, such as alumina, can be coated with a metal halide emulsion, and then loosely packed, or packed tightly into cakes.

Silver bromide is the material commonly used as a major component for standard black and white photographic film. When exposed to light, the silver bromide is activated and when subsequently immersed in a developer solution, the silver metal is reduced from the silver halide and metal is coated onto the carrier, such as the plastic base layer or the ceramic powder particle. Thus, a layer of the silver bromide carrying ground is provided and selected regions are exposed to light, for instance in the same manner as are the selected regions energized in the electroless method. Small quantities of other metals can be used, such as gold, mercury and other heavy metal ions to make the metal halide sensitive to different wavelengths of light, as is well known in the art of photographic film chemistry.

Typically, unlike in the method of selective metallization using electroless plating, all layers are selectively exposed to light before any layers are subjected to an environment that will immediately induce the metallization. For this reason, it is necessary to choose the carrier for the metal halide so that it partially blocks light from one layer to the next, so that light applied to a subsequent layer will not expose regions on layers which have already been exposed. Once all layers have been so exposed, a developing solution is pumped through the porous ground medium under the conditions that will cause the metal to reduce and coat as metal on the carrier. In addition to a developer, it is also typical to apply a "stop" solution, such as acetic acid, to stop the reduction of the metal, followed by a "fixing" bath, which dissolves away the remaining, unactivated metal halide. A typical "fixer" used is sodium hyposulphite. Because the sodium hyposulphite dissolves away unexposed metal halide, it is necessary to use a carrier other than the metal halide alone as the ground, or else all of the ground would dissolve away during the metallization phase, and none would remain to hold the metallized portions together during the layer joining phase.

It is also possible, to expose each layer to light, provide a developer and fixer, thus inducing the metallization, remove the developer, provide an additional layer, expose the next layer to light, provide a developer and fixer, etc., thus, metallizing each layer before the next layer is added. This would be directly analogous to the method according to which selective metallization is conducted by electroless plating. However, the preferred method is to expose all of the layers to light before developing and thus metallizing any of the layers.

As has been mentioned the method of the invention basically entails two phases: the selective metallization phase and the layer joining phase. Any of the methods of selective metallization, i.e. photo-induced electroless; silver halide; semiconductor (discussed below), etc., can be used with any of the methods for joining layers, i.e. electroplating; electroless plating; sintering, etc. The combinations are many, but are identifiable from inspection. All of the possible combinations will not be discussed herein, however, all are contemplated as part of the invention, and are intended to come within the scope of the claims appended hereto. Thus, for instance, the metal halide metallization stage can be combined with either the electroless plating, the electroplating, or the sintering method of the invention for joining the layers together.

Another means by which to selectively metallize regions of a ground is to use a photosensitive semiconductor. Two versions of this second phase embodiment are contemplated as included within the invention. One version of this embodiment takes advantage of the photo-deposition phenomenon. If a suitable semiconductor particle is connected to a body of suitable metal and immersed in an electroplating solution, and a beam of light is applied to the side of the particle opposite the side that is connected to the metal, metal will be reduced from the solution and will plate onto the location that has been struck by the light. The light must be of sufficient photon energy relative to the type of semiconductor. A solar cell arises at the junction between the semiconductor and the fluid. See Pleskov or Reiche, cited in the Background section above. The semiconductor can be provided in wafers, particles or powders or cakes. It can also be provided as a coating on a porous metal screen or mat, either woven or non-woven. After each layer has been metallized, the layers can be joined according to any of the methods discussed above.

The second version using a semiconductor treated ground is conceptually similar to the concept underlying the photocopying process. Highly resistive semiconductor particles are used, each particle connected to a body of metal and immersed in an electroplating solution with an anode in contact with the solution. An electrical contact is provided to the side of the semiconductor distant from the light source (the dark side). The electrical contact is connected to the anode through a circuit. A voltage is applied, so that there is a potential difference between the semiconductor and the anode When the semiconductor surface is struck by a light, the resistance is markedly decreased, and current flows, causing the metal ions in the plating solution to plate onto the locations where the light has struck. As each subsequent layer is laid down, the electrical contact must be maintained.

As is the case with the metal halide method of selectively metallizing patterns on a layer, the layers of parts whose layers have been selectively metallized using any of the semiconductor embodiments discussed can be joined using any of the layer joining methods discussed, i.e. electroless, electroplate or sintering, etc.

The foregoing discussion has concentrated on the discrete layer, in situ mode of fabrication identified above. The following discussion concentrates on the discrete layer ex situ mode of fabrication identified above. According to this preferred embodiment of the method and apparatus of the invention, a lamp and an optical mask (of one of several different types) can be used to fabricate separate layers situated outside (ex situ) of the vessel in which they are later joined, rather than single layers of ground applied on top of previously heated and plated layers situated inside (in situ) of the vessel in which they are later joined. This embodiment is conducive to mass production of small parts, parts having a relatively thick and uniform cross-section made up of separately formed layers, or parts which are not sensitive to the relocation of layers during fabrication required by this embodiment. This ex situ method can be applied to any of the techniques for selectively metallizing a ground, i.e. electroless, metal halide or semiconductor.

An embodiment of the apparatus of the invention suitable for this technique is shown schematically in cross-section in FIG. 6. A glass plate 612 acts as a mechanical foundation for a porous, electrically non-conductive, nylon screen 610, used as the non-conductive ground layer material analogous to the porous ground used in the embodiment discussed above. The screen has 150 μm openings and is 163 μm thick. The nylon screen 610 and glass plate 612 are immersed in a shallow bath 608 of electroless nickel plating solution, such as sold by Enthone Inc. under the trade designation NI-429M Special.

A shadow mask 606 may be a sheet of aluminum having an opening of the desired shape cut therethrough. The opening 614 is in the desired shape of the layer to be made in this particular step. Alternatively, a glass photomask can generate the light pattern. A programmable liquid crystal photomask can also be used. The latter provides great flexibility, although it may entail added complexity. A 300 watt Tungsten halogen bulb 602 with an aluminum reflector 604 is used as a light source to heat and thus excite the nylon substrate to the required energy level to cause electroless plating from the solution.

The method of this embodiment of the invention is similar to that shown in FIG. 4, and is shown schematically in flow chart form in FIG. 7. The process begins at 702. Initially, the material for a layer of the ground, in this case the nylon screen 610, is sensitized in stannous chloride solution (such as is sold by Transene Co. Inc., under tradename "sensitizer solution C"). The nylon screen is next activated in palladium chloride solution (such as is sold by Transene, Co., Inc. under tradename "activator solution D"). The nylon screen is immersed 706 in electroless plating solution mentioned above and the mask is placed relative to the screen. The light source heats the screen and solution selectively through the opening 614 in the mask 606 and electroless nickel is plated onto the selected portion of the nylon screen.

Three kinds of mask systems can be used to practice the invention: contact masks, proximity masks, and projection masks. Contact masks require an intimate contact between the mask and the ground material. If a contact mask is used, care must be taken not to disturb the ground material and the fluid flow. A proximity mask is placed close to the ground, but not touching it. The gap between the mask and the ground material affects the resolution of the image. A gap of about 0.2 to 0.5 mm provides suitable results for the embodiment shown in FIG. 6. A projection mask uses a lens to project an image of the mask onto the ground surface.

The rate at which the metal will plate onto the ground depends on parameters known to one of ordinary skill in the art. It is advantageous to plate on at least 200–1000 Å, and preferably nearer to the high end of the range. The lower limit depends on the surface quality of the ground and the quality of the deposit of metal. This lower limit is necessary to insure that a continuous film of metal will be plated, and also, if electroplating is used as the means to join the layers, to insure that enough metal will be plated to carry the current required for electroplating.

At 710 it is determined if additional electroless plated layers are required. Typically, more than one are required. Additional layers are prepared according to the same steps 704, 706 and 708 discussed above. The additional layers can be identical to the firs L or they can differ in layer material, electroless plating solution (and thus metal plated), shape of mask cutout (and thus the shape of the metal plating area), thickness of layer material, or any combination of the foregoing to achieve desired characteristics in the finished part. Although FIG. 7 shows schematically that each layer is prepared in series, a practical way to form the pieces for many layers is to lay out many ground screens and corresponding masks, to immerse them all in the same plating solution and to energize them all at the same time, using a single light source or an array of light sources. Whether the layers are prepared simultaneously or in series, both ex situ methods are contemplated by the invention and are covered by the attached claims.

After the required number of layers have been plated by the electroless method, they are placed 712 in an electrolytic plating bath. The electrolytic plating can be conducted in the same vessel as is the electroless plating, such as in the embodiment discussed above, or, more typically in the case of individually plated screens, the electroplating can be conducted in a different vessel. The first layer is conveniently joined to a metal base plate, such as nickel, which acts as the cathode. The layers can all be stacked on top of each other at this point, or a single additional layer can be stacked onto the first layer. Electrolytic solution is provided 716 and an electric potential difference is applied 718 between the anode and the cathode base plate (and thus the touching metallized layers) so that metal is reduced and plates upon the metal regions of the two layers. As a result of this electroplating, the two layers are joined together. Further, additional metal is plated to the metal regions of the two layers that are in contact with plating solution. For layers of 160 μm thick (most of this thickness being made up of the thickness of the unplated ground alone) an electroplated deposition between the two layers of about 20 μm is adequate to join the layers. Thus, the part acquires additional bulk in addition to becoming securely joined. The electroplating can be satisfactorily performed at room temperature with an apparent current density (i.e., based on the base plate surface area) of approximately 0.03–0.05 A/cm$^2$.

If additional layers are required, the method returns at 722 to 723 where an additional layer is stacked onto the forming article. Next, the potential difference and current is again applied at 718. The repetitive process continues until the desired shape of the product has been achieved.

Rather than joining the layers together in individual pairs, as is described above, all of the layers can be stacked together before any electroplating takes place, and then the electroplating can be applied to the entire unit all at the same time. (This is indicated in FIG. 7 by virtue of the fact that step 712 can accommodate placing a single layer or a plurality of layers in the electroplate environment.) Of course, it is also possible to use a combination of the two methods, adding some layers individually to the stack and others being added in a group. Because each of the parts are porous, the electroplating solution contacts significant surfaces between the two layers, and thus joins them together.

Figure 8A:
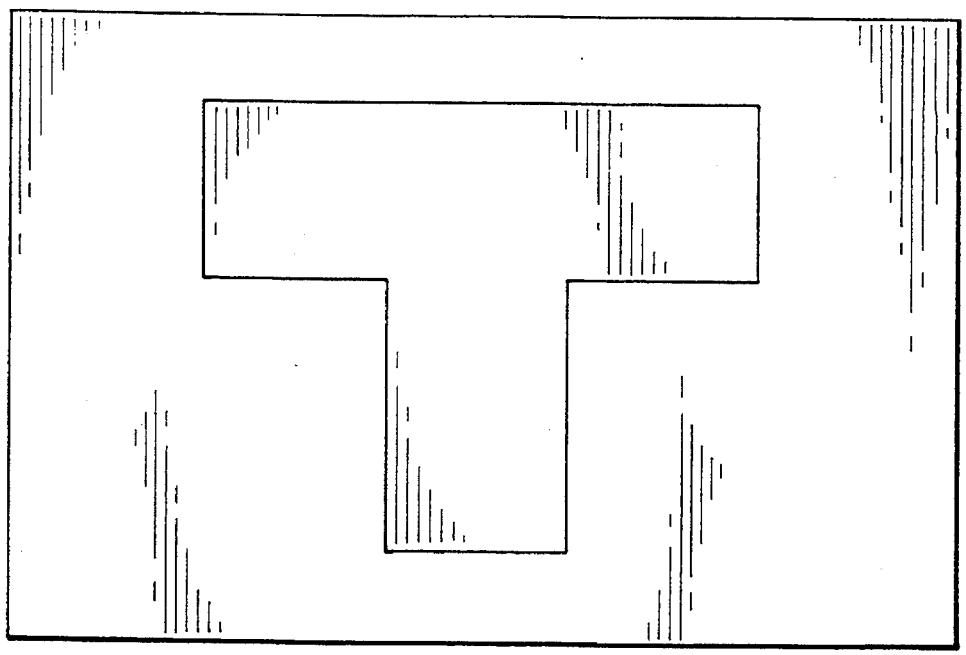
FIG. 8a shows schematically a plan view of a part formed by electroless plating using the apparatus shown in FIG. 6.
Figure 8B:
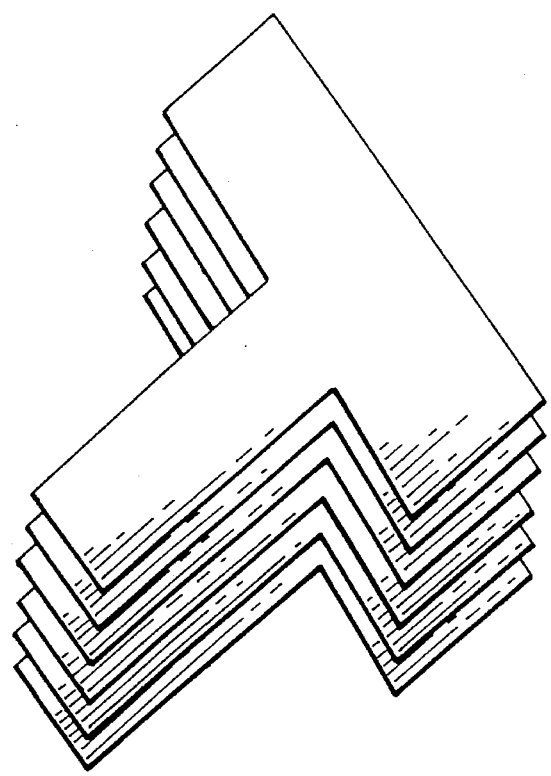

After the part is built up by electroplating, the metal portions are dissociated from the unplated ground, in this case the nylon screen. As has been mentioned above, firing the part at 500° C. in air burns out the unplated nylon, leaving the metal part intact. FIG. 8a shows schematically a single layer of a part that has been formed by electroless plating, and FIG. 8b shows schematically a part that has been built up from a number of layers, such as are shown in FIG. 8a. The width of the base of the "T" shape is five mm. For each layer, enough nickel was electroplated on to the screen to add 10–50 μm of thickness, if nickel were only plated on an area the size of the projection of the cross-section of the solid parts of the screen. Because metal is also plated all the way around the threads that make up the screen, the screen, which was initially about 160 μm thick, grows only to between 170 to 200 μm thick after plating. A stack of five such screens results in a part of approximately 0.9 mm in thickness.

Greater resolution in the finished part can be achieved by using thinner porous non-conductive sheets, such as the nylon screen used in the example discussed.

While the mask technique has been described in the context of an electroless plating selective metallization first stage followed by an electroplating second joining stage, the mask technique can also be used with the metal halide or semiconductor methods of selective metallization first phase, coupled with any of the methods discussed for joining layers together. The same is true for the continuous metallizing embodiment next explained.

Figure 9:
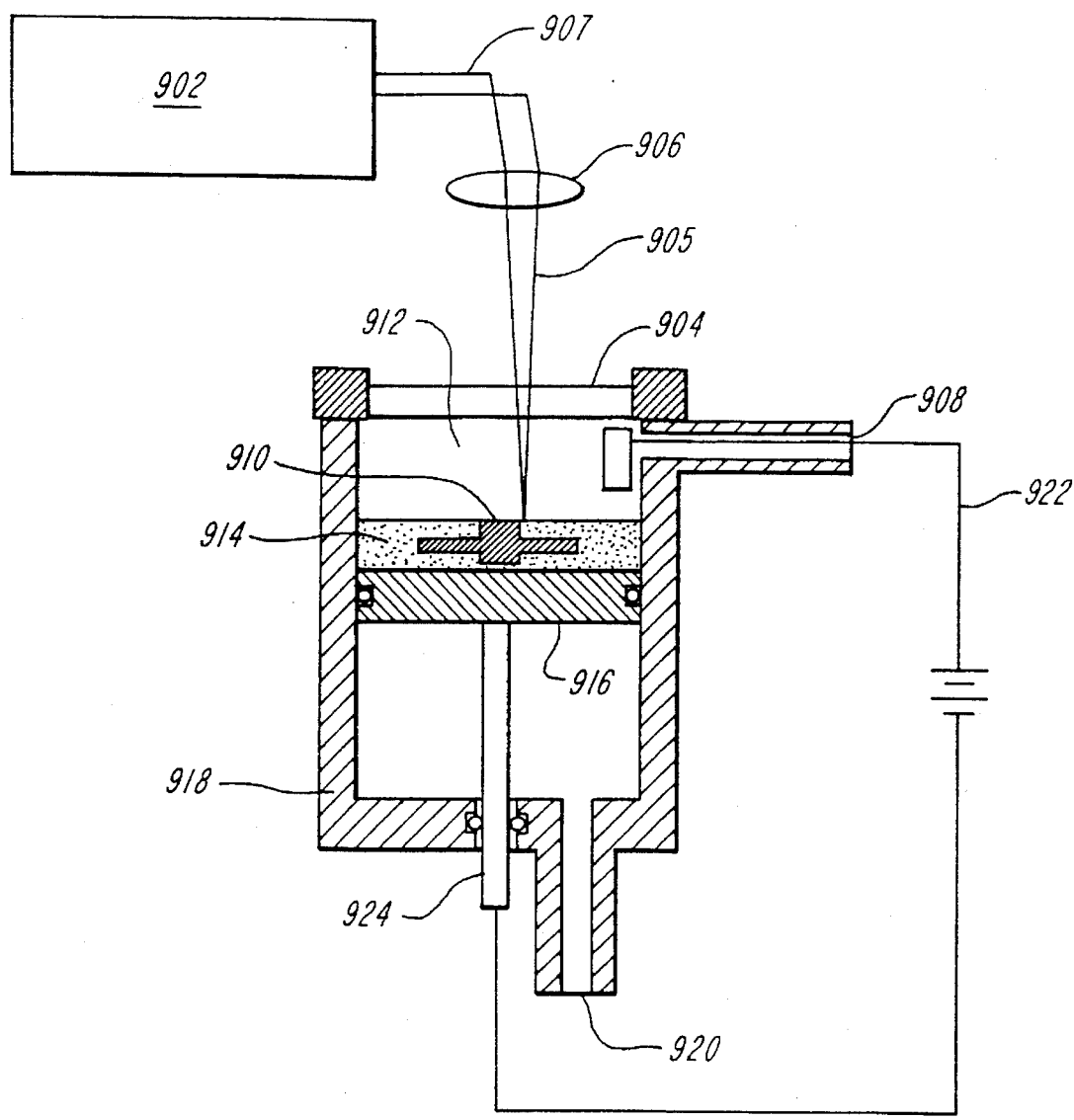
FIG. 9 shows schematically a cross-sectional elevation view of a third preferred embodiment of the apparatus of the invention for continuous photo-electroforming using a continuous flow of suspended powder.

The foregoing discussion has concentrated on two discrete layer modes of fabrication: the discrete layer in situ metallizing method first disclosed above with respect to FIGS. 3, 4 and 5, (designated generally at 1408$_2$ in FIG. 4a) or the layer-wise, ex situ method (illustrated in FIGS. 6, 7 and 8 (designated generally at 1408$_1$ in FIG. 4a). The following discussion concentrates on the fully continuous mode of metallization identified above (and designated generally at 1408$_3$ in FIG. 4a). A preferred embodiment of the apparatus of the invention for use with the continuous technique, is shown schematically in cross-section in FIG. 9. The embodiment is described first with respect to an embodiment using electroless plating to metallize the layers, indicated at 1408$_{a3}$ in FIG. 4a.

Fine powder, such as alumina powder, is used as the ground. The powder is first sensitized and activated as described above and then is suspended in an electroless plating solution 912. (The suspension of powder need not have long term stability if continuous agitation is applied to the suspension.) This suspended powder solution is forced by relatively high pressure (applied at high pressure port 908) to flow through a porous piston 916 inside pressure chamber 918. Powder particles are filtered by the piston 916 and the growing layer of powder 914 and are continuously deposited, similar to snow falling and accumulating, thereby increasing the thickness of the powder layer 914.

A laser beam 905 is generated by laser 902, is first reflected by scanner mirror 907 and scans over flat field lens 906 thereby being focused onto the surface of the powder bed 914. The density of the powder in the solution is rather low and does not effectively occlude the laser beam. The laser beam heats the powder and induces selective metallization of the powder at desired locations. The piston 916 moves downward gradually as the powder 914 builds up, such that the laser focal point is kept at the surface of the growing accumulation of powder.

As is discussed below, rather than using the electroless method for the selective metallization phase, either the metal halide or one of the semiconductor methods can also be used.

After all of the selective metallization is completed, the article is joined in the direction the powder has been building up, analogous to the joining of layers having a thickness of one particle. This direction will be referred to below as the "build-up" direction. In a typical case, this direction will be vertical. However, the invention can theoretically be practiced in other directions, since the principal driving force to accumulate the particles on the growing part is due to the pressure applied, not gravity. As in the case of the embodiments discussed above, joining of the layers can be by either electroless plating, electroplating, sintering, or any other appropriate means. The electroplating method of joining layers is discussed first.

The electroless solution is replaced by an electrolytic plating solution, and a plating circuit 922 is applied between the electrolytic solution and the formed metallized article 910. Electrical contact to the metallized article 910 can be through the piston rod 924, or according to some other known means. The plating circuit applies an electric potential difference between the solution and the part, causing metal from the solution to plate onto the metallized powder, thus joining the mass of metallized powder by metal deposition. The metallized powder pile 910 acts as a porous cathode. This process produces a part with fine pores. In the final step, the chamber is opened and the unplated powder is removed, revealing the finished part.

In this fully continuous approach, the material is deposited continuously like falling snow and the light beam also scans continuously such that the resolution in the direction of particle fall can be as fine as the particle size. As a result, fine and complex three dimensional geometries with almost no steps in any direction can be built.

It is also possible to use a photo mask or a programmable liquid crystal mask in connection with this continuous method, in which case a laser would not be used.

Rather than using electroplating to join the particles together in the build-up direction, for some very small parts, it is possible to use electroless plating to join the particles. Typically, after all of the powder has been metallized, the electroless plating solution, or other conditions (temperature, etc.) are adjusted to cause additional electroless plating to arise everywhere that photo-induced electroless plating has occurred in the selective metallization phase. Thus, the particles are joined in both the plane in which they have been deposited, and in the build-up direction.

Similarly, rather than using either electroplating or electroless plating to join the metallized powder particles, particularly in the build-up direction, sintering techniques can be used. After the selective metallization has been done for the entire part, the environment is adjusted to facilitate sintering of the metal regions to adjacent metal regions. Those of ordinary skill in the art will readily know how to adjust such conditions.

If the sintering method is used in the second phase, then the powder ground can be conductive initially, such as a tungsten powder that has been electroless plated with nickel in the first stage. If either electroless or electroplate methods are used for the second phase, however, then the powder ground must be non-conductive. Otherwise, in the second stage, the entire block would be plated with metal, rather than only the metallized regions.

Both the metal halide and the semiconductor methods of selective metallization can be used with the continuous, "snow-fall" build up mode of the invention. Metal halide coated particles, e.g. of alumina or other suitable composition, are used as the ground, suspended in a solution. The solution is not an electroless solution, since the metallization comes from the metal of the metal halide, not a metal in the solution. The particles are suspended in the solution to provide a controlled deposition of particles. The laser beam is moved about the surface of the accumulating depth of metal halide particles, just as in the electroless embodiment. After the full depth of the article has been laid down and exposed to light, the solution is altered, typically by completely pumping it out and replacing it with a developer solution to reduce the activated metal, causing elemental metal to coat the ground, such as the alumina particle. After the developer, a stop solution and then a fixer are applied to terminate the development process and to remove the unactivated metal halide respectively. The ground, however, remains. These various fluids can be pumped through the full body of the ground due to its porous nature. Joining of the layers takes place according to any of the methods discussed, such as by electroless plating, electroplating or sintering.

For the semiconductor methods, it is beneficial to provide particles on the order of 100 µm or smaller, having at least two generally opposed, well defined regions, a first being substantially semiconductor and the second being substantially metal. The particles are suspended in an electrolyte solution, and are deposited, like falling snow, as discussed above. The falling of the particles is conducted so that, in general, the metal region of the particles is oriented toward the porous piston, leaving substantially all of the semiconductor regions facing toward the laser light source. As the laser beam falls upon each particle, metal is reduced from the solution onto the semiconductor due to the photocell effect discussed above. See generally Wrighton, 1977, cited above. Each individual semiconductor and metal particle has a self contained photoelectric plating capability. As the particles gradually build up, the laser beam is trained selectively to the locations that are to be metallized, and gradually, the part grows within the growing ground of particles.

After all of the selective metallization has occurred, the individual metallized particles are joined according to any of the methods discussed above. Even the electroplating embodiment is suitable for use in the second, joining phase of the invention. Although all of the particles will have a small amount of metal on them, only those that have been selectively metallized will be in contact with other fully metallized particles, forming an electric circuit back to the base form. There may be a few partially metallized particles around the perimeter of the selectively metallized region that are in contact with the metallized region, and which will experience electroplating, but the number of such particles will be small.

With respect to any of the embodiments discussed, it will be understood that at the end of the selective metallization phase, a continuous metal phase will exist within the ground. The metal phase may not yet be strong enough, or full enough to satisfy the required specifications for the finished part, but there will be a substantially continuous metal phase. Thus, if the electroplating method is used to join all of the layers, or regions of depth together, the current will be able to flow throughout the entire piece, this, even though for any one layer, there may be discontinuous regions, such as those identified at 524 in panel 500c of FIG. 5.

The achievable resolution of the method of the invention depends on the embodiment chosen. For the discrete layer ex situ mode, using multiple single layers formed on a base form which are later joined, the thickness of each layer determines the resolution in the direction of build-up (vertical as shown in FIG. 6) and the pore size of the base form determines the resolution in the plane perpendicular to the direction of build-up. In the discrete layer in situ mode described in connection with FIGS. 3, 4 and 5, the resolution in the direction of build-up depends on the thickness of the layer of ground deposited. The resolution in the plane perpendicular to this direction depends on the pore size in the ground. In the continuous powder mode disclosed in connection with FIGS. 6, 7 and 8, the resolution in any direction depends on the size of one powder particle.

The resolution of the invention in the electroless embodiment of the selective metallization phase also depends on limitations of accuracy due to heat transfer in the layer material and the solution, which affects the areas that are energized to the extent necessary to cause plating. In the continuous snow fall embodiment disclosed in connection with FIG. 9, the heat transfer effect is more pronounced in the direction of flow of the plating solutions. Resolution on the order of 10 μm for laser-induced electroless metal deposition on a solid surface is achievable. See Andre M. T. P. van der Putten, Jan W. M. Jacobs, Jan M. G. Rikken, and Kees G. C. de Kort, "Laser-induced Metal Deposition from the Liquid Phase", SPIE (Society of Photo-optical Instrumentation Engineers) vol. 1022, pp. 71–76, 1988. It is believed that discontinuities in thermal conductivity due to the presence of powder particles reduce the control problems caused by thermal diffusion and permit resolution on an order of less than 10 μm.

The wavelength of the light used also affects the resolution of the method. According to Rayleigh's Criterion, the wavelength of the light affects the possible resolution of the light pattern in all of the embodiments of the invention discussed. Thus, the dimensional error due to diffraction for the infrared light induced electroless plating method disclosed in connection with FIGS. 6, 7 and 8 is on the order of 1 μm.

To manufacture a layer of a typical part for industrial uses the exposure time can be reduced for each layer a scanning focused laser is used. Many industrial parts are largely hollow, or at least each cross-sectional slice through the object is largely hollow. Using a scanning laser, it would only be necessary to trace out the shape of the solid portions of the hollow object, rather than plating an entire surface, such as is the case with the "T" -shaped example shown in FIG. 8. Further, even with respect to a piece like the "T" example, having large surface areas to be plated, high accuracy, and thus precise control and the attendant slowness of the process, is only required at the edges of the metallized areas. Thus, broader areas can be exposed to the excitation energy in the interior regions of the part being plated.

The invention has been discussed above largely in connection with micro fabrication of mechanical parts for use in mechanical systems. However, the invention is useful for other applications, such as making small and complicated multi-layer electronic packages, with the various layers having either the same or different properties. Another suitable application is metal or ceramic-in-a-metal-matrix inserts for injection molding tools used for making complicated small sized plastic parts. It is expected that the invention will have highest applicability for fabrication of small-sized, complicated shape, tight tolerance parts.

What is claimed is:

1. A method for making a metal-containing article, comprising the steps of:
   a. providing a layer of a porous ground on a selected area of a base substantially immersed within a fluid that contains a metal source;
   b. exposing selected regions of said layer of porous ground to light, thereby metallizing said selected regions;
   c. repeating steps (a) and (b) a selected number of times to produce a selected number of layers; and
   d. joining said metallized regions of at least two of said layers.

2. The method of claim 1, said porous ground comprising a powder of metal coated with an electrically non-conducting material.

3. The method of claim 1, further comprising the step of detaching from said metallized regions selected regions of said ground that have not been metallized.

4. The method of claim 1, further comprising the step of further transforming selected regions of said ground that have not been metallized.

5. The method of claim 4, said step of further transforming comprising the step of impregnating said unmetallized ground with a structural composition.

6. The method of claim 1, said metallizing step comprising the step of electroless plating said selected regions.

7. The method of claim 6, said step of joining said metallized regions comprising electroless plating.

8. The method of claim 6, said step of joining said metallized regions comprising electroplating.

9. The method of claim 6, said step of joining said metallized regions comprising sintering.

10. The method of claim 1, said metallizing step comprising the step of light induced semiconductor plating said selected regions.

11. The method of claim 10, said step of joining said metallized regions comprising electroless plating.

12. The method of claim 10, said step of joining said metallized regions comprising electroplating.

13. The method of claim 10, said step of joining said metallized regions comprising sintering.

14. A method for making a metal-containing article comprising the steps of:
   a. providing a layer of a porous ground on a selected area of a base;
   b. contacting said porous ground with an electroless plating solution;
   c. exposing selected regions of said layer of porous ground to light, thereby metallizing said selected regions;
   d. repeating steps (a) and (b) and (c) a selected number of times, each successive layer provided adjacent a layer that has already been formed, to produce a selected number of metallized layers, said metallization adding metal within said metallized regions of each individual layer and between said metallized regions of adjacent layers.

15. The method of claim 14, said electroless plating solution comprising a metal selected from the group consisting of: copper, nickel, cobalt and palladium.

16. A method for making a metal-containing article, comprising the steps of:
   a. providing a layer of a porous, metal salt-containing ground on a selected area of a base;
   b. exposing selected regions of said layer of porous ground to light, thereby activating said selected regions;
   c. repeating steps (a) and (b) a selected number of times to produce a selected number of layers;
   d. metallizing said activated regions; and
   e. joining said metallized regions of at least two of said layers.

17. The method of claim 16, said step of joining said metallized regions comprising the step of electroless plating additional metal within said metallized regions of individual layers and between said metallized regions of adjacent layers.

18. The method of claim 16, said step of joining said metallized regions comprising the step of electroplating additional metal within said metallized regions of individual layers and between said metallized regions of adjacent layers.

19. The method of claim 16, said step of joining said metallized regions comprising the step of sintering metal within said metallized regions of individual layers and between said metallized regions of adjacent layers.

20. The method of claim 16, said ground comprising a ceramic coated with a metal halide.

21. The method of claim 16, said ground comprising a polymeric sheet coated with a metal halide.

22. A method for making a metal-containing article, comprising the steps of:
   a. providing porous ground on a selected area of a base substantially immersed within a fluid that contains a metal source;
   b. while the providing of step (a) is continuing, exposing selected regions of said porous ground to light, thereby metallizing said selected regions to a selected degree and to a preselected depth; and
   c. joining said metallized regions of porous ground that are adjacent to each other.

23. The method of claim 22, said metallizing comprising the step of electroless plating.

24. The method of claim 22, said metallizing comprising the step of semiconductor plating.

25. The method of claim 22, said step of joining said metallized regions comprising the step of electroless plating additional metal within said metallized selected volume of porous ground.

26. The method of claim 22, said step of joining said metallized regions comprising the step of electroplating additional metal within said metallized porous ground.

27. The method of claim 22, said step of joining said metallized regions comprising the step of sintering within said metallized of porous ground.

28. A method for making a metal-containing article, comprising the steps of:
   a. providing porous ground on a selected area of a base;
   b. contacting said porous ground with an electroless plating solution;
   c. while the providing of step (a) is continuing, exposing selected regions of said porous ground to light, thereby metallizing said selected regions to a preselected degree and to a preselected depth.

29. A method for making a metal-containing article, comprising the steps of:
   a. providing porous metal salt ground on a selected area of a base;
   b. while the providing of step (a) is continuing, exposing selected regions of said porous ground to light, thereby activating said selected regions to a preselected degree and to a preselected depth;
   c. metallizing the selectively activated regions and
   d. joining said metallized regions of porous ground that are adjacent to each other.

30. The method of claim 29, said step of joining said metallized regions comprising the step of electroless plating additional metal within said metallized porous ground.

31. The method of claim 29, said step of joining said metallized regions comprising the step of electro plating additional metal within said metallized porous ground.

32. The method of claim 29, said step of joining said metallized regions comprising the step of sintering within said metallized porous ground.

* * * * *